United States Patent
Hayashi et al.

(10) Patent No.: US 10,023,477 B2
(45) Date of Patent: Jul. 17, 2018

(54) TREATMENT SOLUTION SUPPLY METHOD, TREATMENT SOLUTION SUPPLY APPARATUS, AND NON-TRANSITORY COMPUTER-READABLE RECORDING MEDIUM

(71) Applicant: Tokyo Electron Limited, Tokyo (JP)

(72) Inventors: Masato Hayashi, Koshi (JP); Toyohisa Tsuruda, Koshi (JP); Masayuki Kajiwara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 426 days.

(21) Appl. No.: 14/724,922

(22) Filed: May 29, 2015

(65) Prior Publication Data

US 2015/0375170 A1 Dec. 31, 2015

(30) Foreign Application Priority Data

Jun. 25, 2014 (JP) .................................. 2014-130151
Apr. 14, 2015 (JP) .................................. 2015-082541

(51) Int. Cl.
| | |
|---|---|
| *C02F 1/463* | (2006.01) |
| *C02F 1/461* | (2006.01) |
| *C02F 103/02* | (2006.01) |
| *G03F 7/30* | (2006.01) |

(52) U.S. Cl.
CPC .......... *C02F 1/463* (2013.01); *C02F 1/46104* (2013.01); *C02F 1/461* (2013.01); *C02F 2103/02* (2013.01); *C02F 2201/461* (2013.01); *C02F 2201/4612* (2013.01); *C02F 2201/4617* (2013.01); *G03F 7/3007* (2013.01); *G03F 7/3021* (2013.01)

(58) Field of Classification Search
CPC ...... C02F 1/463; C02F 1/46104; C02F 1/461; C02F 2201/461; C02F 2201/4612; C02F 2201/4617; C02F 2103/02
See application file for complete search history.

(56) References Cited

U.S. PATENT DOCUMENTS

| | | | |
|---|---|---|---|
| 5,149,422 A | 9/1992 | Barrington | |
| 5,954,937 A * | 9/1999 | Farmer | ..................... B01J 49/30 204/267 |
| 2008/0272060 A1* | 11/2008 | Taguchi | ................ C02F 1/4602 205/742 |
| 2009/0071843 A1* | 3/2009 | Miyashita | ............. C02F 1/4618 205/746 |
| 2009/0127119 A1* | 5/2009 | Witte | ...................... C02F 1/008 204/662 |

(Continued)

FOREIGN PATENT DOCUMENTS

| | | |
|---|---|---|
| CN | 101759254 A | 6/2010 |
| JP | S60-238172 A | 11/1985 |

(Continued)

*Primary Examiner* — J. Christopher Ball
(74) *Attorney, Agent, or Firm* — Posz Law Group, PLC

(57) ABSTRACT

A treatment solution supply method of supplying a treatment solution to a substrate, the method includes the steps of: applying a DC voltage to the treatment solution; detecting a potential difference between two points in the treatment solution in a state where the DC voltage is applied to the treatment solution; and increasing the DC voltage when the detected potential difference is less than a predetermined reference value.

15 Claims, 22 Drawing Sheets

(56) References Cited

U.S. PATENT DOCUMENTS

2010/0155261 A1 6/2010 Troshin et al.
2014/0124428 A1* 5/2014 Simonette .............. C02F 9/005
　　　　　　　　　　　　　　　　　　　　　　　210/266

FOREIGN PATENT DOCUMENTS

JP　　　2000-279900 A　　10/2000
JP　　　2013-030707 A　　 2/2013

* cited by examiner

FIG.9
(A)
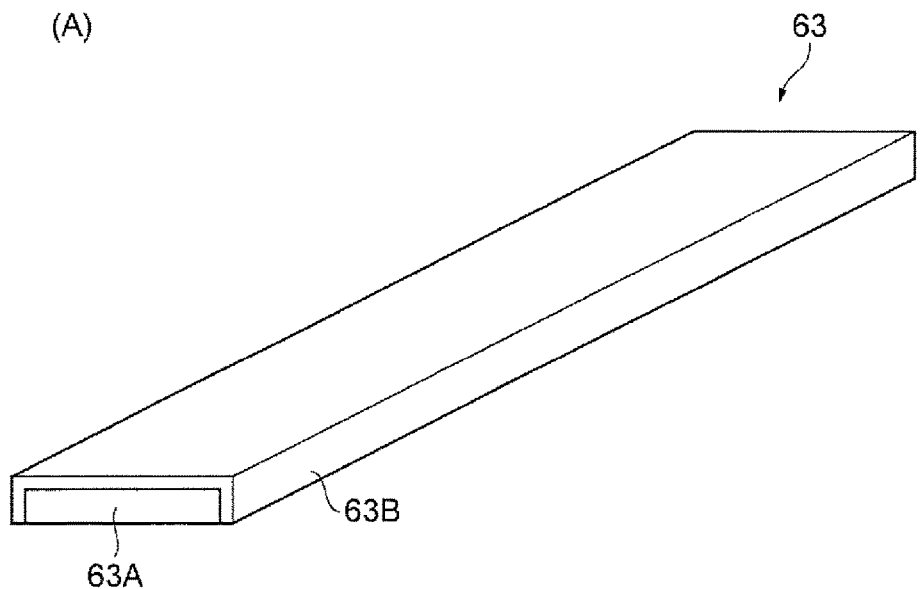
(B)
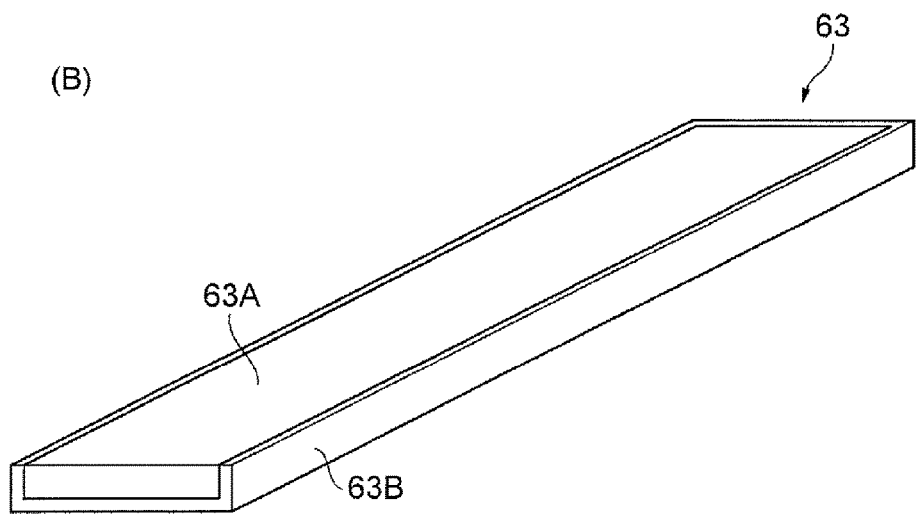

FIG.14
(A)
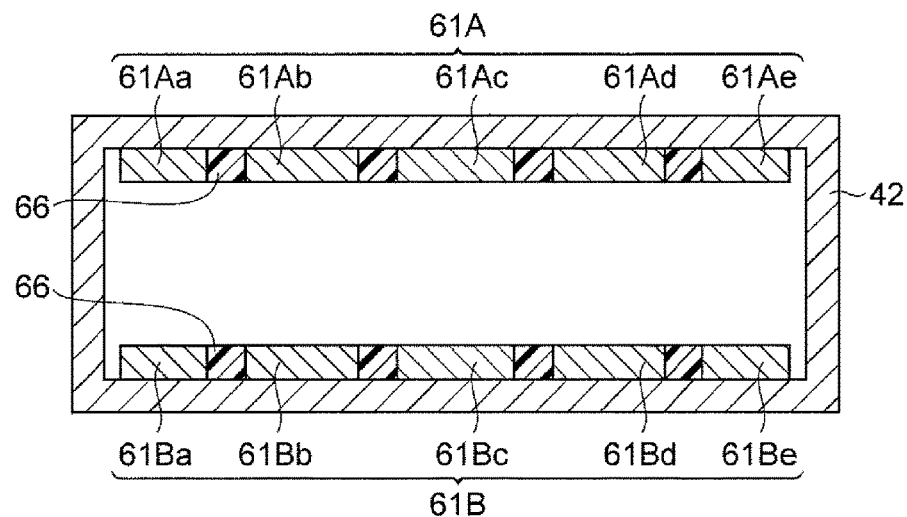
(B)
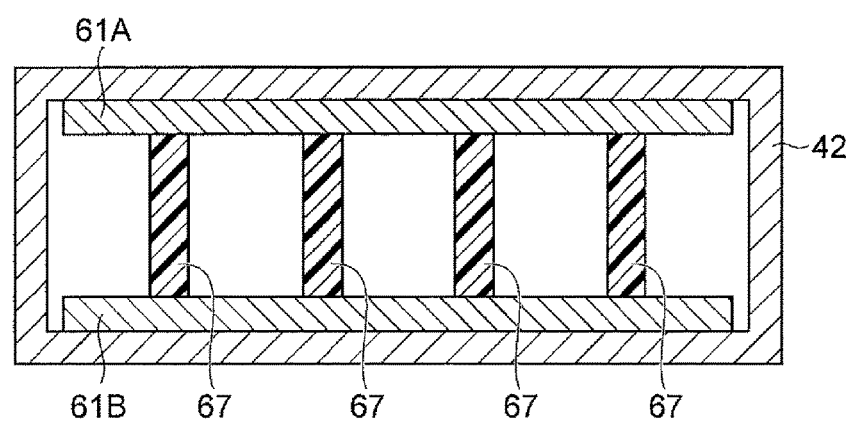

FIG.16
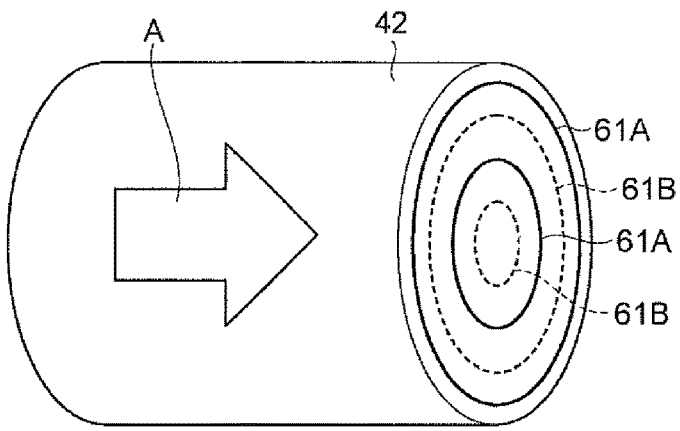
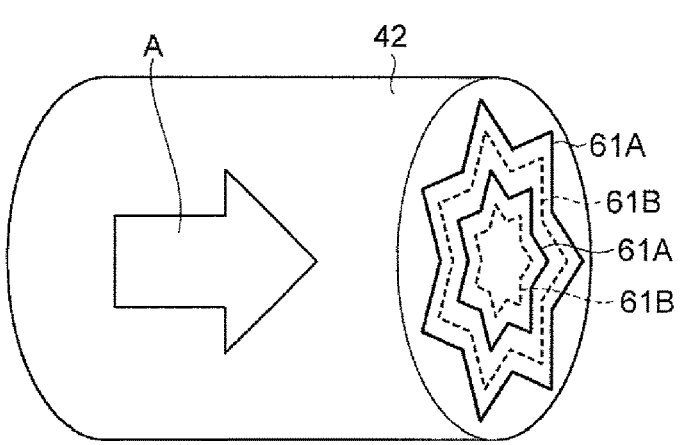
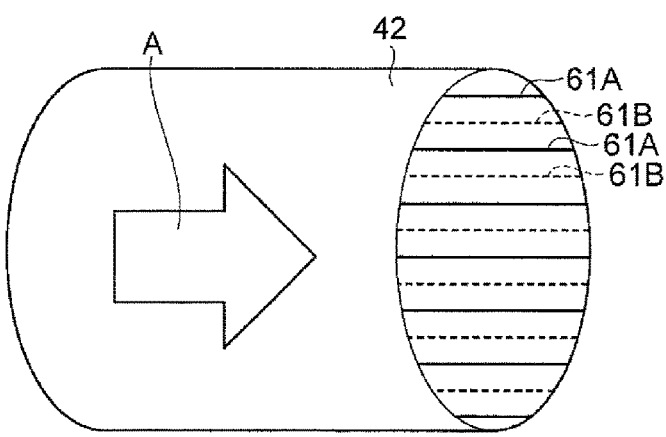

TREATMENT SOLUTION SUPPLY METHOD, TREATMENT SOLUTION SUPPLY APPARATUS, AND NON-TRANSITORY COMPUTER-READABLE RECORDING MEDIUM

CROSS REFERENCE TO RELATED APPLICATIONS

This application is based upon and claims the benefit of priority of the prior Japanese Patent Application No. 2014-130151, filed in Japan on Jun. 25, 2014, and the prior Japanese Patent Application No. 2015-082541, filed in Japan on Apr. 14, 2015, the entire contents of which are incorporated herein by reference.

BACKGROUND OF THE INVENTION

1. Field of the Invention

The present invention relates to a treatment solution supply method, a treatment solution supply apparatus, and a non-transitory computer-readable recording medium.

2. Description of the Related Art

Conventionally, in a photolithography process in a manufacturing process of a semiconductor device, for example, a treatment of supplying a treatment solution such as a developing solution, pure water, a thinner or the like to a wafer to thereby apply the treatment solution onto the wafer is performed. In order to prevent, as much as possible, supply of fine foreign substances (particles) floating in the treatment solution to the wafer, there is a known method of previously collecting the particles in a pipe for supplying the treatment solution.

Japanese Laid-open Patent Publication No. 2013-30707 discloses a treatment solution supply method using an apparatus including a particle collecting part. This method collects the particles by electrodes arranged in a treatment solution supply pipe. The electrodes apply a DC voltage to the treatment solution in the treatment solution supply pipe. When the voltage is applied to the treatment solution, particles charged to polarities different from the polarities of the electrodes are attracted to positions corresponding to the electrodes in the treatment solution supply pipe. Thus, the particles as collected.

SUMMARY OF THE INVENTION

However, when such a treatment solution supply apparatus is continuously used, the efficiency of collecting particles may decrease with time, and there is a room for improvement in the particle collecting efficiency in this regard.

An object of the present invention is to keep the particle collecting efficiency for a long enough time.

A treatment solution supply method according to the present invention is for supplying a treatment solution to a substrate, the method including the steps of: applying a DC voltage to the treatment solution; detecting a potential difference between two points in the treatment solution in a state where the DC voltage is applied to the treatment solution; and increasing the DC voltage when the detected potential difference is less than a reference potential difference.

According to the treatment solution supply method, the DC voltage applied to the treatment solution is increased when the potential difference between the two points in the treatment solution is less than a reference potential difference. Therefore, the DC voltage applied to the treatment solution is increased to compensate for a temporal decrease in DC voltage applied to the treatment solution. Thus, the force attracting particles in the treatment solution is kept constant for a long period. Accordingly, the particle collecting efficiency can be kept for a long enough period.

The treatment solution supply method may further include the step of, before the step of applying a DC voltage to the treatment solution, passing the treatment solution through a filter. In this case, by previously passing the treatment solution through the filter, particles with a large grain diameter are collected by the filter. Accordingly, the number of particles collected by applying the DC voltage to the treatment solution decreases. This makes it possible to further suppress the temporal change in particle collecting efficiency.

The treatment solution supply method may further include the step of: detecting a current flowing between two points in the treatment solution in a state where the DC voltage is applied to the treatment solution, wherein when at least either a state where the detected potential difference is less than the reference potential difference or a state where the detected current is more than a reference current applies, the DC voltage may be increased. The current flowing between the two points in the treatment solution correlates with the number of particles in the treatment solution. Therefore, also when the current is more than the reference current, the DC voltage is increased to enable the particles in the treatment solution to be more surely collected.

The DC voltage may be applied to the treatment solution that is passing through a treatment solution supply pipe. In this case, applying the DC voltage at a place close to a discharge port for the treatment solution makes it possible to collect also particles mixed into the treatment solution during movement to the place, and therefore more surely reduce the number of particles remaining in the treatment solution after supply.

The current flowing between the two points in the treatment solution may be detected on a downstream side from a place to which the DC voltage is applied. In this case, it is possible to detect the state of particles remaining in the treatment solution directly before supply and adjust the DC voltage according to the state. Therefore, it is possible to more surely reduce the number of particles remaining in the treatment solution after supply.

A treatment solution supply apparatus according to the present invention is a treatment solution supply apparatus configured to supply a treatment solution to a substrate, the apparatus including: a treatment solution supply pipe that supplies the treatment solution to the substrate; an electrode pair that is provided in the treatment solution supply pipe and applies a DC voltage to the treatment solution in the treatment solution supply pipe; a DC power supply that applies the DC voltage to the electrode pair; a potential difference detector that detects a potential difference between two points in the treatment solution supply pipe separate from each other in a facing direction of the electrode pair in a state where the DC voltage is applied to the treatment solution; and a control unit that controls the DC power supply, wherein the control unit is configured to control the DC power supply to increase the DC voltage when the potential difference detected by the potential difference detector is less than a reference potential difference.

According to the treatment solution supply apparatus, the DC voltage applied to the treatment solution is increased when the potential difference between the two points in the treatment solution is less than a reference potential difference. Therefore, the DC voltage applied to the treatment solution is increased to compensate for a temporal decrease in DC voltage applied to the treatment solution. Thus, the force attracting particles in the treatment solution is kept constant. Accordingly, the particle collecting efficiency can be kept for a long enough period.

The treatment solution supply apparatus may further include a straightening member at least on an upstream side from a portion where the electrode pair is provided in the treatment solution supply pipe. In this case, the straightening member distributes the treatment solution in a direction crossing the direction in which the treatment solution supply pipe extends. Accordingly, the particles collected from the treatment solution are distributed to the whole treatment solution supply pipe. This makes is possible to further suppress the temporal change in particle collecting efficiency.

The treatment solution supply apparatus may further include a straightening member between electrodes of the electrode pair in the treatment solution supply pipe. By providing the straightening member between the electrodes of the electrode pair, the flow rate of the treatment solution flowing between the electrodes of the electrode pair is uniformized by the straightening member. This makes it possible to further suppress the temporal change in particle collecting efficiency.

An interval between electrodes of the electrode pair on an upstream side of the treatment solution supply pipe may be larger than an interval between electrodes of the electrode pair on a downstream side of the treatment solution supply pipe. There is a tendency that when the interval between the electrodes of the electrode pair is large, particles with larger electric charge are collected, whereas particles with smaller electric charge are not collected but pass to the downstream side, as compared with the interval between the electrodes of the electrode pair is small. Therefore, the interval between the electrodes of the electrode pair on the upstream side of the treatment solution supply pipe is made larger than the interval between the electrodes of the electrode pair on the downstream side of the treatment solution supply pipe, thereby making it possible to collect particles with larger electric charge on the upstream side of the treatment solution supply pipe and collect particles with smaller electric charge on the downstream side of the treatment solution supply pipe. Accordingly, it is possible to equalize the numbers of particles collected on the upstream side and the downstream side of the treatment solution supply pipe and therefore further suppress the temporal change in particle collecting efficiency.

Each of electrodes constituting the electrode pair may have a plurality of segments divided by boundaries along a direction in which the treatment solution supply pipe extends, and the control unit may be configured to control the DC voltage to apply a higher DC voltage to a segment located closer to a middle side of the treatment solution supply pipe among the plurality of segments. Generally, the flow rate of liquid passing through the middle portion of the pipe is higher than the flow rate of the liquid passing through the side closer to the pipe wall. Further, to collect particles with a constant collecting efficiency, it is necessary to apply a higher DC voltage to the treatment solution as the flow rate of the treatment solution is higher. Accordingly, applying the highest DC voltage to the segments located closer to the middle side of the treatment solution supply pipe makes it possible to uniformize the particle collecting efficiency on the middle side and the pipe wall side of the treatment solution supply pipe and further suppress the temporal change in collecting efficiency.

The electrode pair may be made of at least one kind selected from a group consisting of metal, Si doped with a dopant, Ge doped with a dopant, SiC, and vitrified carbon. In particular, when the electrode pair is composed of one of Si doped with a dopant, Ge doped with a dopant, SiC, and vitrified carbon, it is possible to suppress metallic contamination of the treatment solution. Further, when the electrode pair is composed of SiC or vitrified carbon, the shape of the electrode pair becomes easily processed into a complicated shape.

The treatment solution supply apparatus may further include a current detector that detects a current flowing between two points in the treatment solution in a state where the DC voltage is applied to the treatment solution, wherein the control unit may be configured to control the DC power supply to increase the DC voltage when at least either a state where the potential difference detected by the potential difference detector is less than the reference potential difference or a state where the current detected by the current detector is more than a reference current applies. The current flowing between the two points in the treatment solution correlates with the number of particles in the treatment solution. Therefore, also when the current is more than the reference current, the DC voltage is increased to enable the particles in the treatment solution to be more surely collected.

The current detector may detect a current flowing between two points in the treatment solution on a downstream side from the electrode pair. In this case, it is possible to detect the state of particles remaining in the treatment solution directly before supply and adjust the DC voltage according to the state. Therefore, it is possible to more surely reduce the number of particles remaining in the treatment solution after supply.

A computer-readable recording medium according to the present invention records a program thereon for causing the treatment solution supply apparatus to perform the above-described treatment solution supply method. In this specification, examples of the computer-readable recording medium include a non-transitory tangible medium (non-transitory computer recording medium) (for example, various main storages or auxiliary storages, and a propagation signal (transitory computer recording medium) (for example, a data signal that can be provided over a network).

According to the present invention, it is possible to keep the particle collecting efficiency for a long enough period.

BRIEF DESCRIPTION OF THE DRAWINGS

FIG. 9 is a schematic view illustrating a structure of a probe.

FIG. 14 is a cross-sectional view taken along a line XIV-XIV in FIG. 13 and a view illustrating its modification example.

FIG. 16 is a view illustrating examples of arrangement of electrodes in the treatment solution pipe.

DETAILED DESCRIPTION OF THE INVENTION

Figure 1:
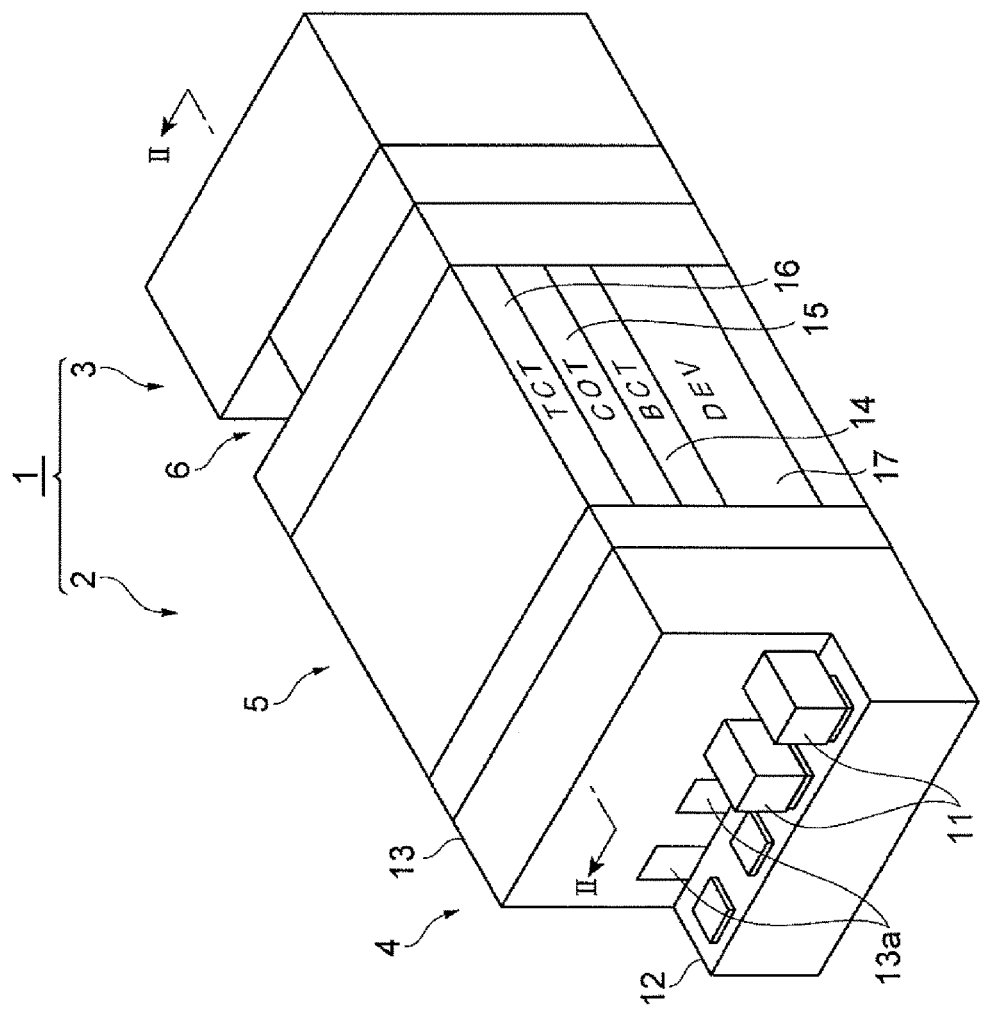
FIG. 1 is a perspective view illustrating a coating and developing system.

Hereinafter, embodiments will be described referring to the drawings. In the description, the same codes are used for the same components or the same functions to omit duplicated description.

<Substrate Treatment System>

A substrate treatment system 1 includes a coating and developing apparatus 2 and an exposure apparatus 3. The exposure apparatus 3 performs exposure processing on a resist film. Specifically, an energy line is radiated to a portion to be exposed of the resist film (photosensitive coating) by a method such as liquid-immersion exposure. As the energy line, an ArF excimer laser, a KrF excimer laser, a g-line, an i-line or extreme ultraviolet (EUV) can be exemplified.

The coating and developing apparatus 2 performs a treatment of forming the resist film on a front surface of a wafer W (substrate) before the exposure processing by the exposure apparatus 3 and performs a developing treatment on the resist film after the exposure processing. The wafer W is formed of a circular disk in this embodiment, but its circle shape may be partially cut out. As the wafer W, a wafer formed of a shape other than the circle, such as a polygon, may be used.

Figure 2:
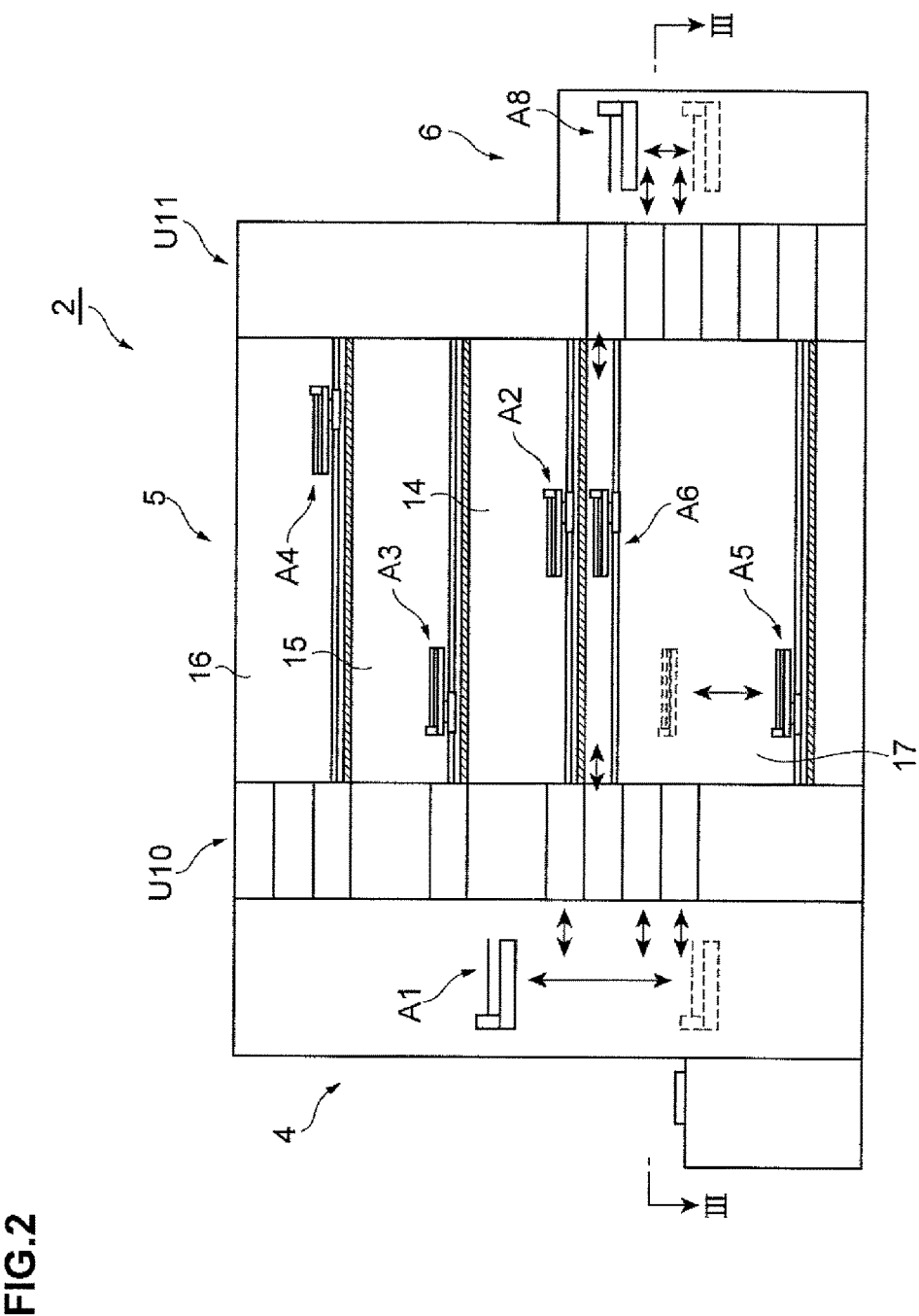
FIG. 2 is a cross-sectional view taken along a line II-II in FIG. 1.
Figure 3:
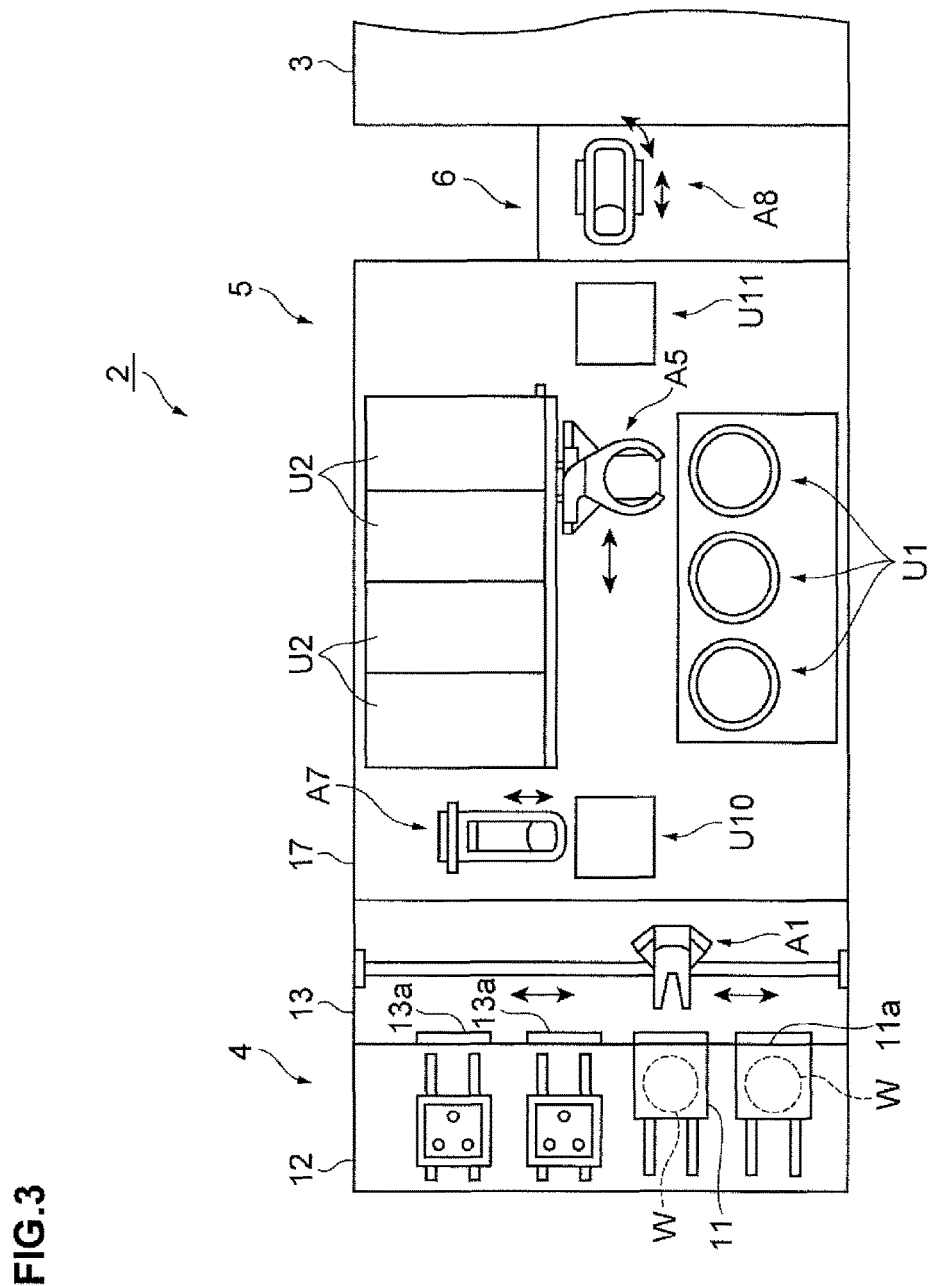
FIG. 3 is a cross-sectional view taken along a line III-III in FIG. 2.

As illustrated in FIG. 1 to FIG. 3, the coating and developing apparatus 2 includes a carrier block 4, a treatment block 5, and an interface block 6. The carrier block 4, the treatment block 5, and the interface block 6 are arranged side by side in a horizontal direction.

The carrier block 4 has a carrier station 12 and a transfer-in and transfer-out section 13. The transfer-in and transfer-out section 13 is interposed between the carrier station 12 and the treatment block 5. The carrier station 12 has a plurality of carriers 11. The carrier 11 houses, for example, a plurality of circular wafers W is a sealed state, and has an opening/closing door (not illustrated) for taking the wafer W in/out on one side surface 11a side (see FIG. 3). The carrier 11 is attachable/detachably installed on the carrier station 12 in a manner that the side surface 11a faces the transfer-in and transfer-out section 13 side. The transfer-in and transfer-out section 13 has a plurality of opening/closing doors 13a corresponding to the plurality of carriers 11 on the carrier station 12 respectively. By opening the opening/closing door of the side surface 11a and the opening/closing door 13a simultaneously, the inside of the carrier 11 and the inside of the transfer-in and transfer-out section 13 are communicated with each other. The transfer-in and transfer-out section 13 has a delivery arm A1 built therein. The delivery arm A1 takes the wafer W out of the carrier 11 and delivers it to the treatment block 5, and receives the wafer W from the treatment block 5 and returns it into the carrier 11.

The treatment block 5 has a lower-layer film forming (BCT) module 14, a resist film forming (COT) module 15, an upper-layer film forming (TCT) module 16, and a developing treatment (DEV) module 17. These modules are arranged in the order of the DEV module 17, the BCT module 14, the COT module 15, and the TCT module 16 from the floor face side.

The BCT module 14 is configured to form a lower-layer film on the front surface of the wafer W. The BCT module 14 has a plurality of coating units (not illustrated), a plurality of thermal treatment units (not illustrated), and a transfer arm A2 that transfers the wafer W to these units, which are built therein. The coating unit is configured to apply a treatment solution for forming a lower-layer film on the front surface of the wafer W. The thermal treatment unit is configured to perform a thermal treatment by heating the wafer W, for example, by a hot plate and cooling the wafer W after heating, for example, by a cooling plate. Concrete examples of the thermal treatment performed in the BCT module 14 include a heat treatment for hardening the lower-layer film.

The COT module 15 is configured to form a thermosetting and photosensitive resist film on the lower-layer film. The COT module 15 has a plurality of coating units (not illustrated), a plurality of thermal treatment units (not illustrated), and a transfer arm A3 that transfers the wafer W to these units, which are built therein. The coating unit is configured to apply a treatment solution (resist agent) for forming a resist film on the lower-layer film. The thermal treatment unit is configured to perform a thermal treatment by heating the wafer W, for example, by a hot plate and cooling the wafer W after heating, for example, by a cooling plate. Concrete examples of the thermal treatment performed in the COT module 15 include a heat treatment (PAB: Pre Applied Bake) for hardening the resist film.

The TCT module 16 is configured to form an upper-layer film on the resist film. The TCT module 16 has a plurality of coating units (not illustrated), a plurality of thermal treatment units (not illustrated), and a transfer arm A4 that transfers the wafer W to these units, which are built therein. The coating unit is configured to apply a treatment solution for forming an upper-layer film on the front surface of the wafer W. The thermal treatment unit is configured to perform a thermal treatment by heating the wafer W, for example, by a hot plate and cooling the wafer W after heating, for example, by a cooling plate. Concrete examples of the thermal treatment performed in the TCT module 16 include a heat treatment for hardening the upper film.

The DEV module 17 is configured to perform a developing treatment on the exposed resist film. The DEV module 17 has a plurality of developing units (developing apparatuses) U1, a plurality of thermal treatment units U2, a transfer arm A5 that transfers the wafer W to these units, and a direct transfer arm A6 that transfers the wafer W without passing through these units, which are built therein (see FIG. 2, FIG. 3). The developing unit U1 is configured to partially remove the resist film to thereby form a resist pattern. The thermal treatment unit U2 performs a thermal treatment by heating the wafer W, for example, by a hot plate and cooling the wafer W after heating, for example, by a cooling plate. Concrete examples of the thermal treatment performed in the DEV module 17 include a heat treatment before the developing treatment (PEB: Post Exposure Bake), a heat treatment after the developing treatment (PB: Post Bake) and so on.

On the carrier block 4 side in the treatment block 5, a shelf unit U10 is provided. The shelf unit U10 is provided to extend from the floor face to the TCT module 16, and is divided into a plurality of cells arranged in the vertical direction. Near the shelf unit U10, a raising and lowering arm A7 is provided. The raising and lowering arm A7 raises and lowers the wafer W among the cells in the shelf unit U10.

On the interface block 6 side in the treatment block 5, a shelf unit U11 is provided. The shelf unit U11 is provided to extend from the floor face to a top of the DEV module 17, and is divided into a plurality of cells arranged in the vertical direction.

The interface block 6 has a delivery arm A8 built therein, and is connected to the exposure apparatus 3. The delivery arm A8 is configured to take the wafer W out of the shelf unit U11 and deliver it to the exposure apparatus 3, and receive the wafer W from the exposure apparatus 3 and return it to the shelf unit U11.

<Developing Unit>

Figure 4:
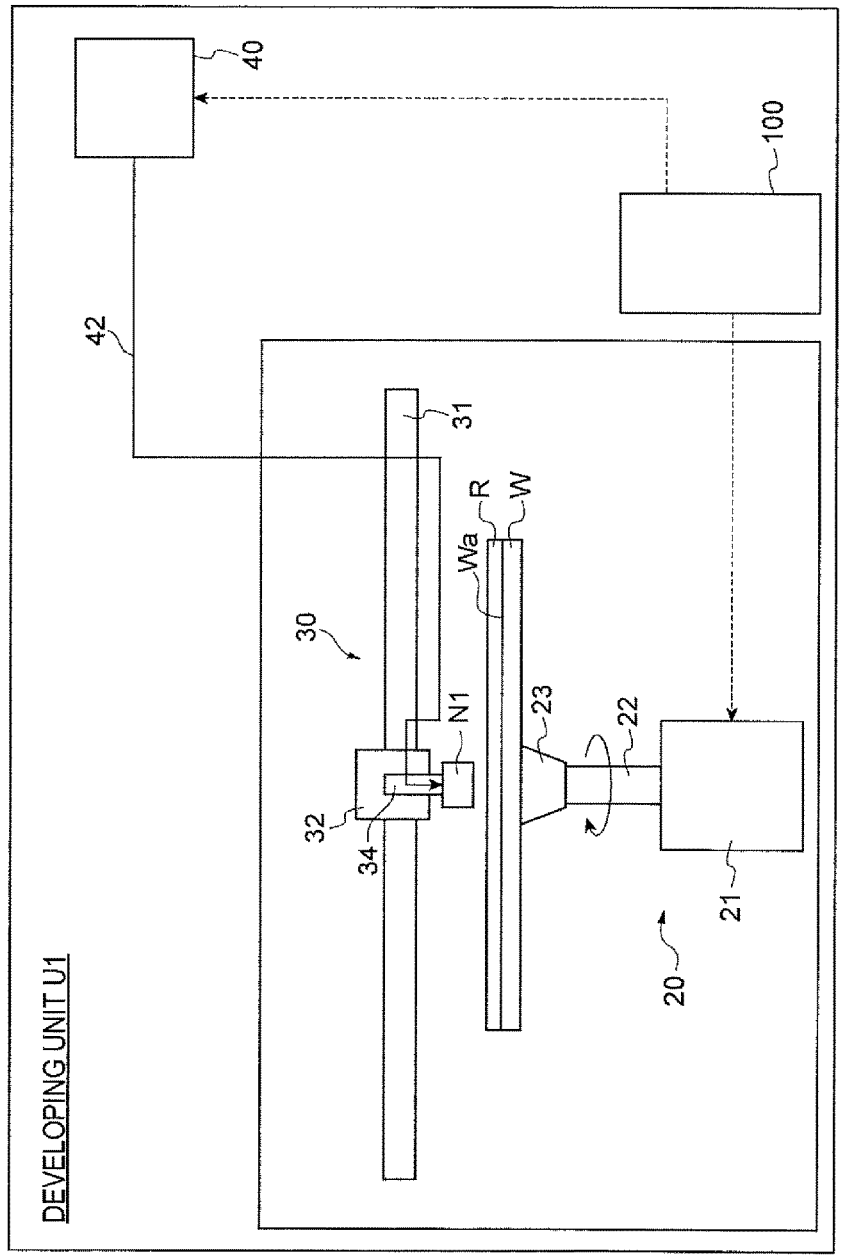
FIG. 4 is a cross-sectional view illustrating a substrate treatment apparatus.

Subsequently, referring to FIG. 4, the developing unit (developing apparatus) U1 will be described in detail. The developing unit U1 includes a rotating and holding part 20, a driving part 30, a developing solution supply apparatus 40, and a control unit 100.

The rotating and holding part 20 has a rotating part 21 and a holding part 23. The rotating part 21 has a shaft 22 protruding upward. The rotating part 21 rotates the shaft 22 using, for example, an electric motor or the like as a power source. The holding part 23 is provided at a tip portion of the shaft 22. On the holding part 23, a wafer W having an exposed resist film R formed on a front surface Wa is horizontally placed. The holding part 23 substantially horizontally holds the wafer W, for example, by suction or the like. More specifically, the rotating and holding part 20 rotates the wafer W around a vertical axis (rotation axis) with respect to the front surface of the wafer W with the posture of the wafer W in a substantially horizontal state. In this embodiment, the rotation axis passes through the center of the wafer W formed of a circle and therefore is also the center axis. In this embodiment, as illustrated in FIG. 4, the rotating and holding part 20 rotates the wafer W clockwise as viewed from above.

The driving part 30 drives a nozzle N1. The driving part 30 has a guide rail 31, a slide block 32, and an arm 34. The guide rail 31 extends along the horizontal direction above the rotating and holding part 20 (wafer W). The slide block 32 is connected to the guide rail 31 so as to be movable in the horizontal direction along the guide rail 31. The arm 34 is connected to the slide block 32 so as to be movable in the vertical direction. The nozzle N1 is connected to a lower end of the arm 34. The driving part 30 moves the slide block 32 and the arm 34 using, for example, an electric motor or the like as a power source and moves the nozzle N1 accompanying the movement. In a plan view, the nozzle N1 moves along a radial direction of the wafer W on a straight line perpendicular to the rotation axis of the wafer W during discharge of the developing solution.

The developing solution supply apparatus 40 supplies a developing solution to the nozzle N1. Developing solutions are classified into the one for a positive photoresist and the one for a negative photoresist, and it is only necessary to appropriately select one of them according to the kind of the resist film R. As the developing solution for the positive photoresist, an alkaline aqueous solution can be exemplified, and as its alkaline component, tetramethylammonium hydroxide (TMAH) can be exemplified. As the developing solution for the negative photoresist, an organic solvent can be exemplified. The details of the configuration of the developing solution supply apparatus 40 will be described later.

The nozzle N1 is disposed above the wafer W held by the holding part 23. The nozzle N1 is called, for example, a liquid contact nozzle which has a discharge port for discharging the developing solution and a lower end surface laterally spreading from the discharge port. The lower end surface is substantially parallel to the main surface of the wafer W. Note that as the nozzle N1, for example, a straight nozzle which extends, for example, in a direction crossing the main surface of the wafer W may be used in place of the liquid contact nozzle.

Note that the developing unit U1 may further include a not-illustrated pure water supply apparatus for supplying pure water to the wafer W and a not-illustrated gas supply apparatus for supplying gas to the wafer W.

First Embodiment

Treatment Solution Supply Apparatus

Figure 5:
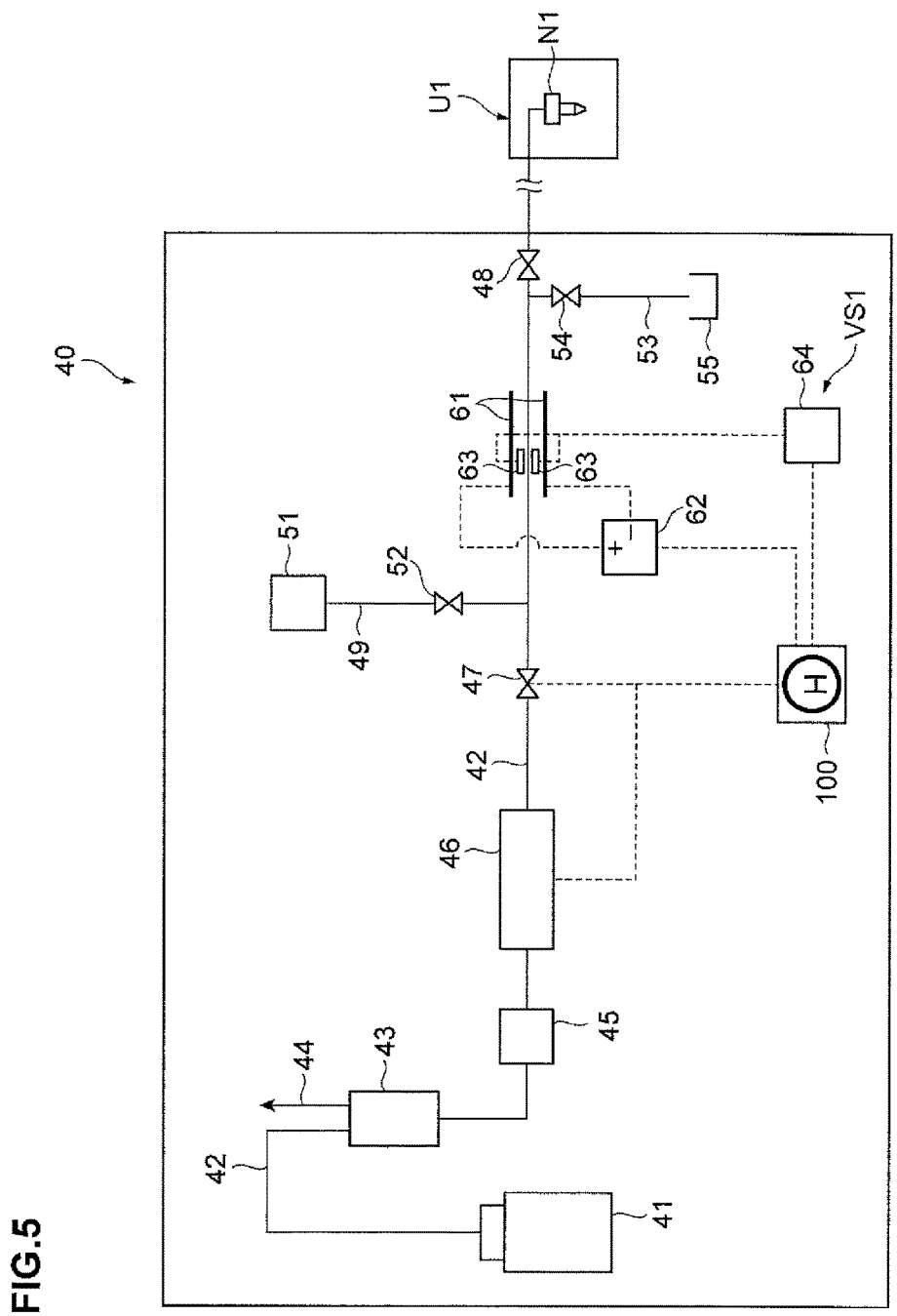
FIG. 5 is a view illustrating the outline of a configuration of a treatment solution supply apparatus according to a first embodiment.

Next, as the first embodiment of the treatment solution supply apparatus, the configuration of the developing solution supply apparatus 40 will be described. FIG. 5 is an explanatory view illustrating the outline of the configuration of the developing solution supply apparatus 40. The developing solution supply apparatus 40 as the treatment solution supply apparatus supplies a developing solution as the treatment solution to the nozzle N1 in the developing unit U1. Note that the developing solution supply apparatus 40 is disposed, for example, inside the treatment block 5 illustrated in FIG. 2.

The developing solution supply apparatus 40 has a developing solution storage tank 41 as a treatment solution supply source that stores the developing solution. The developing solution storage tank 41 is connected with a developing solution supply pipe 42 as a treatment solution supply pipe for supplying the developing solution to the nozzle N1. Namely, the developing solution supply pipe 42 connects the developing solution storage tank 41 and the nozzle N1.

The developing solution supply pipe 42 on the downstream side from the developing solution storage tank 41 is provided with a liquid end tank 43 that temporarily stores the developing solution. To an upper portion of the liquid end tank 43, an exhaust pipe 44 is connected. The exhaust pipe 44 evacuates the atmosphere in the liquid end tank 43. The liquid end tank 43 serves as a buffer tank. More specifically, even when the developing solution to be supplied from the developing solution storage tank 41 runs out, the developing solution supply apparatus 40 can supply the developing solution stored in the liquid end tank 43 to the nozzle N1.

The developing solution supply pipe 42 on the downstream side from the liquid end tank 43 is provided with a filter 45. The filter 45 removes foreign substances in the developing solution. The filter 45 can remove foreign substances of micrometer order contained in the developing solution. Accordingly, the size of the foreign substances to be removed by the filter 45 is larger than the size of foreign substances to be removed by applying a DC voltage to an electrode pair 61. Namely, the filter 45 serves as a coarse filter. Note that in the case where the filter 45 is unnecessary, the filter 45 may be omitted.

The developing solution supply pipe 42 on the downstream side from the filter 45 is provided with a pump 46. The pump 46 pressure-feeds the developing solution from the developing solution storage tank 41 to the nozzle N1. The pump 46 is, for example, a tube-phragm pump. The developing solution supply pipe 42 on the downstream side from the pump 46 is provided with a valve 47. The valve 47 is, for example, an air-operation valve. The valve 47 starts or stops the discharge of the developing solution from the nozzle N1.

The developing solution supply pipe 42 on the downstream side from the valve 47 is provided with the electrode pair 61. The electrode pair 61 is provided inside the developing solution supply pipe 42. The electrode pair 61 applies a DC voltage to the developing solution in the developing solution supply pipe 42. To the electrode pair 61, a power supply unit 62 as a DC power supply is connected. The power supply unit 62 can start and stop application of voltage to the electrode pair 61 and reverse the polarity of the voltage to be applied, in response to the control by the control unit 100.

In the developing solution supply pipe 42, probes 63 are provided at a position corresponding to the electrode pair 61. The probes 63 are connected to a voltage sensor 64. The probes 63 and the voltage sensor 64 serve as a potential difference detector VS1 that detects the potential difference between two points in the developing solution supply pipe 42 separate from each other in a facing direction of the electrode pair 61.

On the downstream side from the electrode pair 61, a valve 48 is provided. The valve 48 is, similarly to the valve 47, an air-operation valve. To the downstream side from the valve 48, the nozzle N1 is connected.

Figure 6:
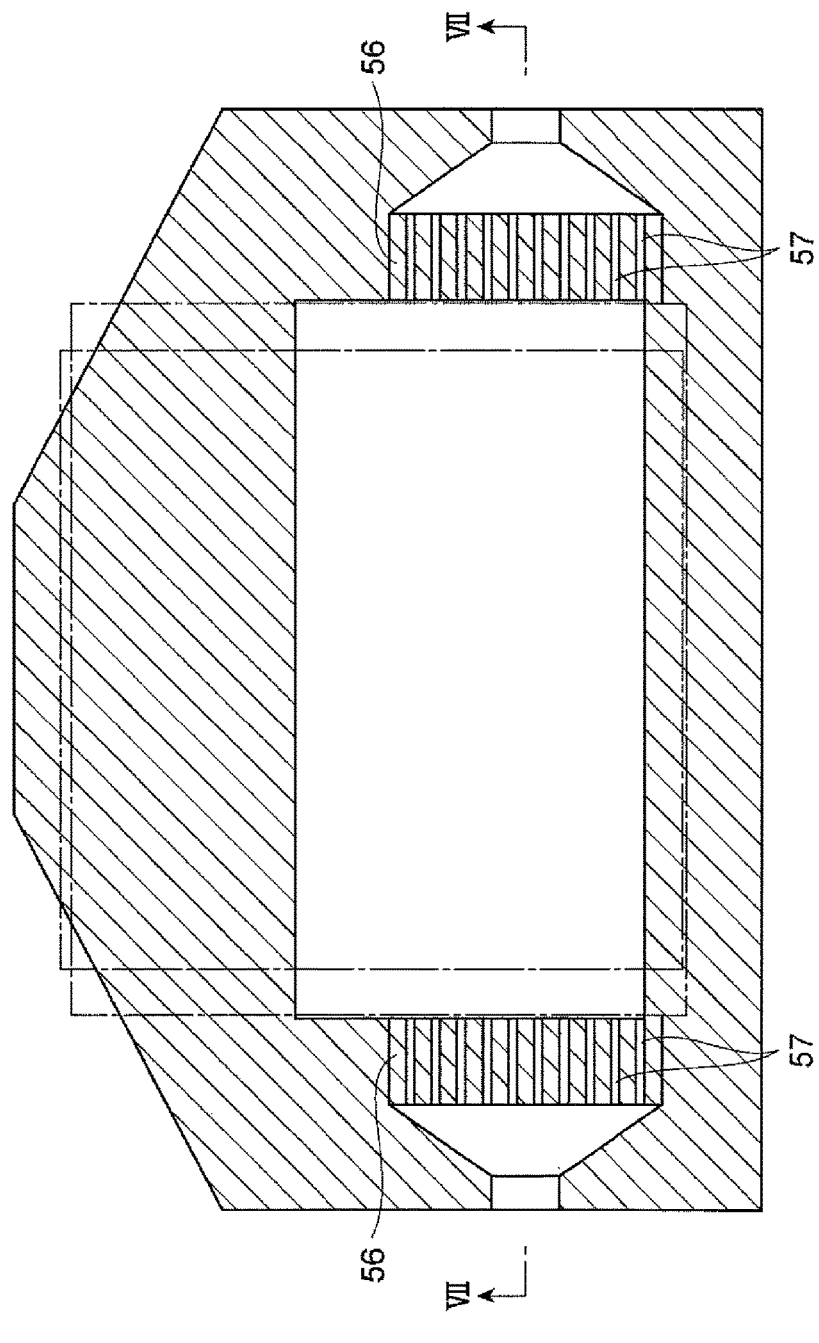
FIG. 6 is a view schematically illustrating a structure of a particle collecting part.
Figure 7:
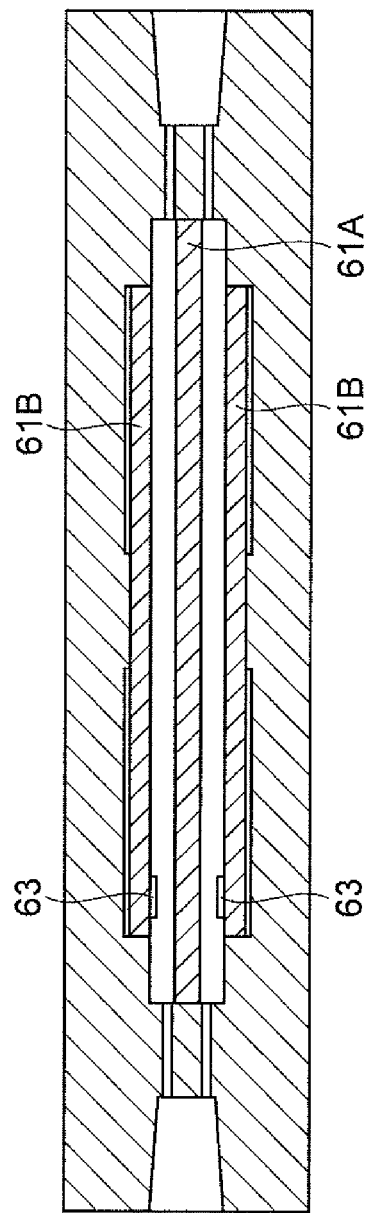
FIG. 7 is a cross-sectional view taken along a line VII-VII in FIG. 6.

An example of the configuration of the electrode pair 61 is illustrated in FIG. 6 and FIG. 7. FIG. 6 is a cross-sectional view schematically illustrating the configuration of the electrode pair 61 and the developing solution supply pipe 42. FIG. 7 is a cross-sectional view taken along a line VII-VII in FIG. 6.

The electrode pair 61 has a positive electrode 61A and a negative electrode 61B. The positive electrode 61A and the negative electrode 61B are, for example, in a flat plate shape. Each of the numbers of the positive electrodes 61A and the negative electrodes 61B may be one or plural. As illustrated in FIG. 7, the number of the positive electrodes 61A is one and the number of negative electrodes 61B is two in this embodiment. The positive electrode 61A and the negative electrode 61B are arranged in parallel with each other. The positive electrode 61A is connected to a positive electrode 62A of the power supply unit 62 (see FIG. 10). The negative electrode 61B is connected to a negative electrode 62B of the power supply unit 62. The power supply unit 62 supplies a DC voltage between the positive electrode 61A and the negative electrode 61B to thereby apply the DC voltage to the developing solution passing between the positive electrode 61A and the negative electrode 61B.

Examples of a material constituting the electrode pair 61 include, for example, metal, Si (silicon) or Ge (germanium) heavily doped with a dopant such as P (phosphor) or B (boron), SiC (silicon carbide), vitrified carbon and so on. In particular, when it is necessary to suppress metallic contamination of the treatment solution, it is preferable to use heavily doped Si, heavily doped Ge, SiC, vitrified carbon or the like as the material constituting the electrode pair 61. Further, in particular, SiC and vitrified carbon are high in degree of freedom of shape, so that when the electrode pair 61 is composed of SiC or vitrified carbon, the shape of the electrode pair 61 becomes easily processed into a complicated shape.

Between one positive electrode 61A and one negative electrode 61B, a pair of probes 63 are disposed. The positions of the probes 63 in the extending direction (namely, the lateral direction in FIG. 6, FIG. 7) of the developing solution supply pipe 42 are not particularly limited, but are preferably the upstream side of the developing solution supply pipe 42.

Further, on the upstream side and the downstream side from the portion where the electrode pair 61 is provided in the developing solution supply pipe 42, flow rate distribution plates 56 as straightening members are provided. The flow rate distribution plate 56 is a member formed in a plate shape and has a plurality of holes 57. The holes 57 are distributed in a direction crossing the direction in which the developing solution supply pipe 42 extends. The flow rate distribution plate 56 has a straightening function of unformizing the flow rate distribution of the developing solution in a cross-section of the flow path formed by the developing solution supply pipe 42. Note that the flow rate distribution plate 56 may be provided at least on the upstream side from the portion where the electrode pair 61 is provided.

Figure 8:
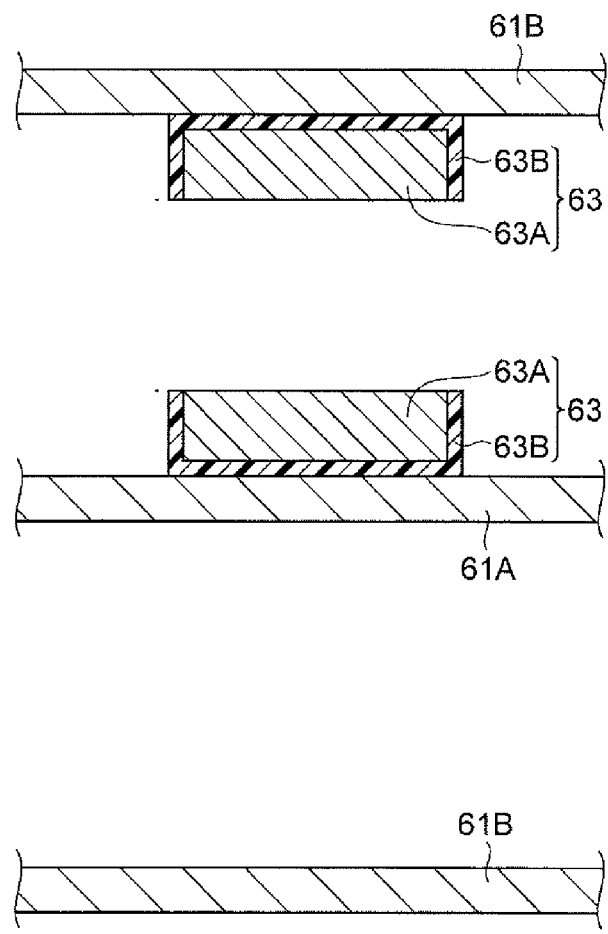
FIG. 8 is an enlarged view illustrating a part of FIG. 7.

FIG. 8 illustrates the probes 63 and their vicinity. Further, FIG. 9 illustrates a perspective view of the probes 63. (A) of FIG. 9 is a perspective view of the probe 63 as viewed from one direction, and (B) of FIG. 9 is a perspective view of the probe 63 as viewed from a direction opposite to that of (A) of FIG. 9.

As illustrated in FIG. 9, the probe 63 is formed, for example, in a substantially rectangular plate shape. The probe 63 has a main body 63A and a coating 63B covering a part of the surface of the main body 63A. The main body 63A has conductivity. The material constituting the main body 63A is, for example, the same material as the material constituting the electrode pair 61. The coating 63B has electric insulation. The material constituting the coating 63B is, for example, a resin. Note that at least a part of the surface of the main body 63A of the probe 63 is not covered with the coating 63B but is exposed.

As illustrated in FIG. 8, the probes 63 are attached to the positive electrode 61A and the negative electrode 61B by bonding the surfaces on the side where the coatings 63B are provided to the positive electrode 61A and the negative electrode 61B. Accordingly, the main bodies 63A of the probes 63 are electrically insulated from the positive electrode 61A and the negative electrode 61B by the coatings 63B.

Returning to FIG. 5, the explanation of the developing solution supply apparatus 40 is continued. At a position on the upstream side from the electrode pair 61 and on the downstream side from the valve 47 of the developing solution supply pipe 42, namely, between the valve 47 and the electrode pair 61 of the developing solution supply pipe 42, a cleaning solution supply pipe 49 is connected which supplies a cleaning solution to the developing solution supply pipe 42. To an end portion of the cleaning solution supply pipe 49 opposite to the side where the cleaning solution supply pipe 49 is connected to the developing solution supply pipe 42, a cleaning solution supply source 51 is connected. The cleaning solution supply source 51 supplies the cleaning solution to the cleaning solution supply pipe 49. Note that the cleaning solution in this embodiment is, for example, pure water, but the cleaning solution may be, for example, a developing solution or a thinner. The cleaning solution is arbitrarily selectable depending on the kind of the treatment solution. Further, the cleaning solution supply pipe 49 is provided with a valve 52 that controls the supply of the cleaning solution to the developing solution supply pipe 42. The valve 52 is, for example, an air-operation valve, similarly to the above-described valve 47.

To a position on the downstream side from the electrode pair 61 of the developing solution supply pipe 42, namely, between the electrode pair 61 and the nozzle N1, a waste solution pipe 53 is connected. The waste solution pipe 53 is provided with a valve 54. The valve 54 is a valve for ejecting, when the cleaning solution is supplied from the cleaning solution supply pipe 49 to the developing solution supply pipe 42, the cleaning solution passed through the position where the electrode pair 61 is provided in the developing solution supply pipe 42, through the waste solution pipe 53. The valve 54 is, for example, an air-operation valve similarly to the above-described valves 47, 52.

At an end portion of the waste solution pipe 53 opposite to the side where the waste solution pipe 53 is connected to the developing solution supply pipe 42, a waste solution part 55 is provided. To the waste solution part 55, the cleaning solution is ejected from the waste solution pipe 53.

Note that in the case where a pure water supply apparatus is provided in the developing unit U1, the pure water supply apparatus may have the same configuration as that of the developing solution supply apparatus 40.

The control of the application of the DC voltage to the electrode pair 61 by the above-described power supply unit 62, the drive operation of the pump 46, and the opening/closing operations of the valves are controlled by the control unit 100. The control unit 100 is composed of, for example, a computer having a CPU, a memory and so on. The control unit 100 can execute programs stored, for example, in the memory to implement the supply of the developing solution by the developing solution supply apparatus 40 and the developing treatment in the developing treatment unit U1. Note that various programs for implementing the supply of the developing solution by the developing solution supply apparatus 40 and the developing treatment in the developing treatment unit U1 may be the ones which are stored, for example, in a computer-readable recording medium H such as a computer-readable hard disk (HD), flexible disk (FD), compact disk (CD), magneto-optical disk (MO), or memory card, and installed from the recording medium H into the control unit 100.

When the developing solution is supplied to the wafer W in the developing solution supply apparatus 40 configured as described above, the developing solution is supplied from the developing solution storage tank 41 to the nozzle N1 through the developing solution supply pipe 42. In this event, the power supply unit 62 applies a DC voltage to the electrode pair 61.

Further, when cleaning of the developing solution supply pipe 42 is performed, the cleaning solution is ejected from the cleaning solution supply source 51 to the waste solution part 55 through the cleaning solution supply pipe 49, the valve 52, the valve 54, and the waste solution pipe 53. In this event, the power supply unit 62 may apply to the electrode pair 61 a DC voltage of a polarity opposite to that when the developing solution is supplied to the wafer W. In this case, particles collected by the electrode pair 61 at the time of supply of the developing solution to the wafer W separate from the electrode pair 61 and flow by the cleaning solution to the waste solution part 55. Further, at the cleaning of the developing solution supply pipe 42, the DC voltage applied to the electrode pair 61 by the power supply unit 62 may be set to zero.

Figure 10:
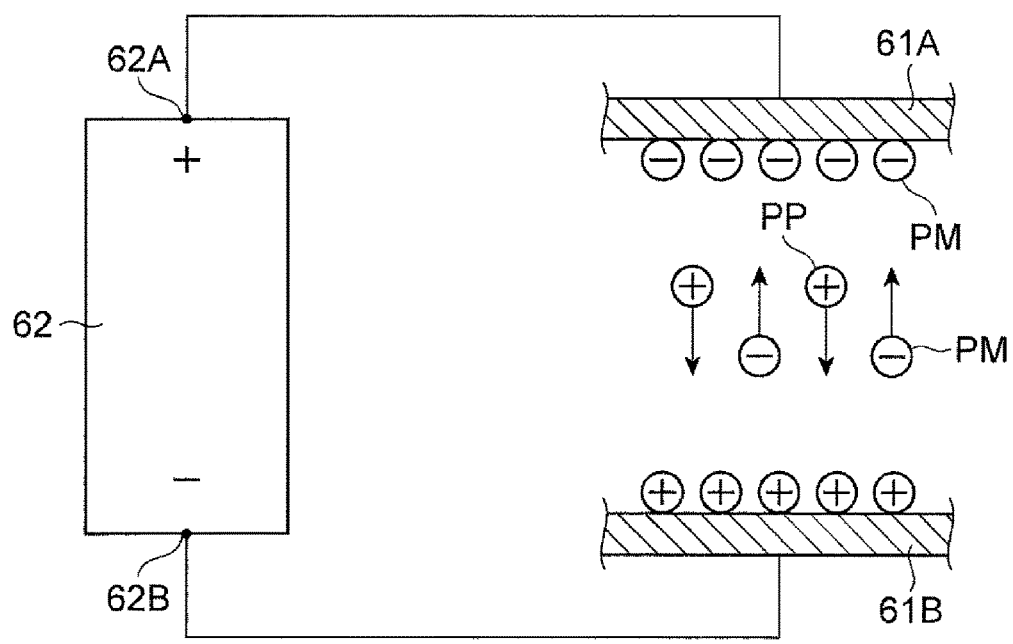
FIG. 10 is a view schematically illustrating movements of particles.

Movements of the particles when the DC voltage is applied to the developing solution will be described referring to FIG. 10. The positive electrode 62A of the power supply unit 62 applies a positive potential to the positive electrode 61A. The negative electrode 62B of the power supply unit 62 applies a negative potential to the negative electrode 61B. Thus, negatively charged particles PM are attracted to the positive electrode 61A. On the other hand, positively charged particles PP are attracted to the negative electrode 61B. In this manner, when the DC voltage is applied to the developing solution, the particles PM, PP are collected by the positive electrode 61A and the negative electrode 61B.

(Treatment Solution Supply Method)

Figure 11:
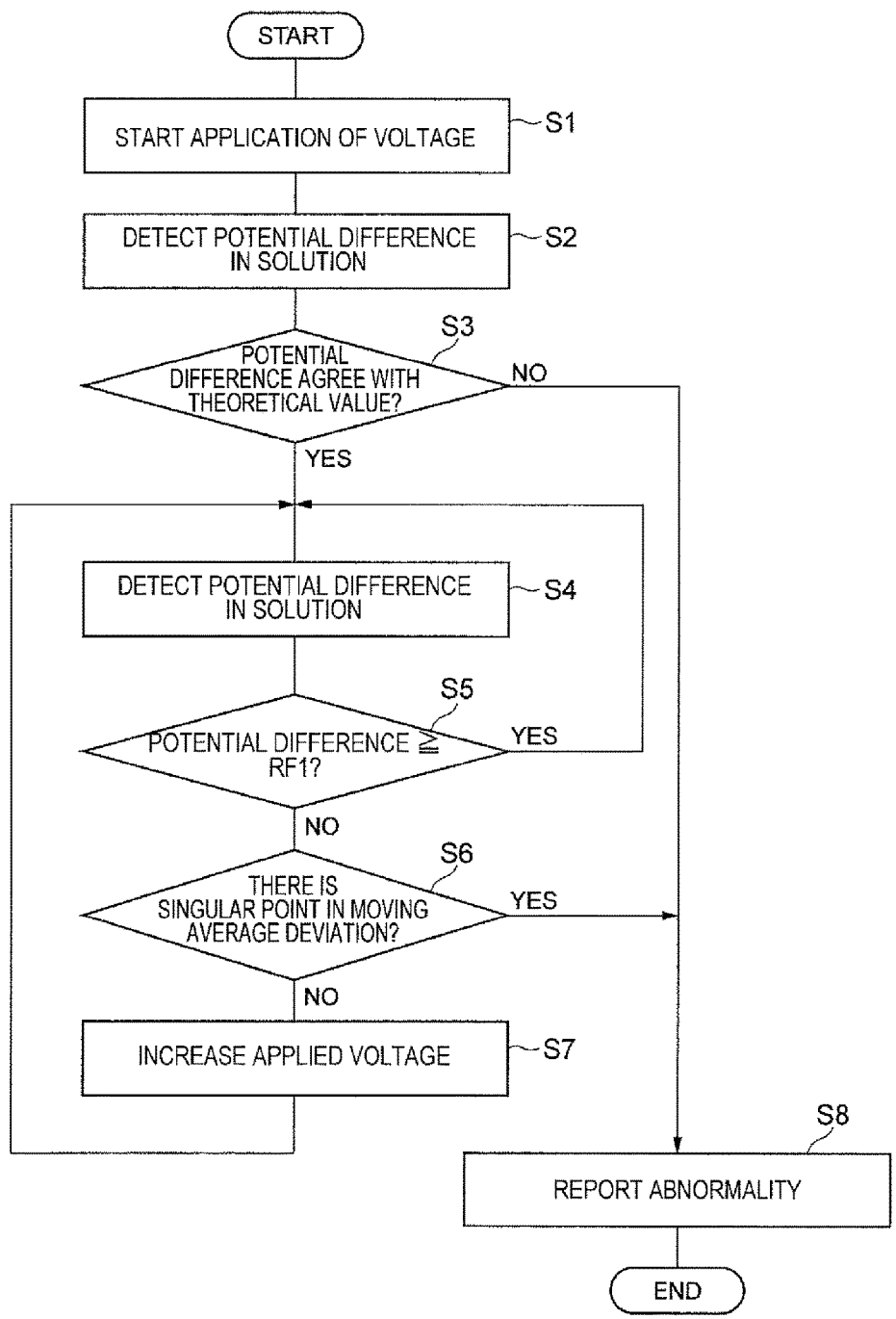
FIG. 11 is a flowchart illustrating a treatment solution supply method according to the first embodiment.

Next, a developing solution supply method in this embodiment will be described referring to FIG. 11. First, the power supply unit 62 starts application of voltage to the electrode pair 61 (Step S1). Then, the voltage sensor 64 detects the potential difference between two points in the developing solution using the probes 63 (Step S2). Then, the control unit 100 determines whether or not the potential difference detected at Step S2 agrees with a theoretical value (Step S3). When the potential difference does not agree with the theoretical value, the control unit 100 reports abnormality to the outside and ends the processing (Step S8).

On the other hand, when the potential difference agrees with the theoretical value, the power supply unit 62 continues the application of voltage to the electrode pair 61. Then, the voltage sensor 64 detects the potential difference between the two points in the developing solution using the probes 63 (Step S4). Then, the control unit determines whether or not the potential difference falls within a threshold range (Step S5). That the potential difference falls within a threshold range means that the potential difference is a predetermined reference value RF1 (first reference value, namely, reference potential difference) or more. On the other hand, the case where the potential difference does not fall within the threshold range means that the potential difference is less than the reference value RF1. The reference value RF1 is, for example, 80% of a design value, and the threshold range is, for example, 80% to 100% of the design value. When the potential difference falls within the threshold range, the processing is returned again to Step S4. When the potential difference does not fall within the threshold range, the control unit 100 determines whether or not there is a singular point in moving average deviation of the potential detected by the voltage sensor 64 (Step S6). The singular point means, for example, sudden temporal change in potential. When there is a singular point, the control unit 100 reports abnormality to the outside and ends the processing (Step S8). On the other hand, when there is no singular point, the control unit 100 increases the DC voltage applied to the electrode pair by the power supply unit 62 (Step S7). Then the processing is returned again to Step S4.

Note that prior to the above-described processing, the developing solution supply apparatus 40 passes the treatment solution through the filter 45. However, when the filter 45 is omitted, the processing by the developing solution supply apparatus 40 of passing the treatment solution through the filter 45 is also omitted.

According to the above-described treatment solution supply method and developing solution supply apparatus 40, when the potential difference between the two points in the treatment solution detected by the voltage sensor 64 is less than the reference value RF1, the DC voltage applied to the treatment solution is increased by the power supply unit 62. Accordingly, the DC voltage applied to the treatment solution is increased to compensate for a temporal decrease in DC voltage applied to the treatment solution. Thus, the force attracting the particles in the treatment solution is kept constant for a long enough period. Accordingly, the particle collecting efficiency can be kept for a long enough period.

Further, in the developing solution supply apparatus 40, the treatment solution passes through the filter 45 before the power supply unit 62 applies the DC voltage to the treatment solution. Therefore, by previously passing the treatment solution through the filter 45, particles with a large grain diameter are collected by the filter 45. Accordingly, the number of particles collected by applying the DC voltage to the treatment solution decreases. This makes it possible to further suppress the temporal change in particle collecting efficiency.

Further, the developing solution supply apparatus 40 further includes the flow rate distribution plates 56 on the upstream side and the downstream side from the portion where the electrode pair is provided in the treatment solution supply pipe. Therefore, the flow rate distribution plates 56 distribute the treatment solution in a direction crossing the direction in which the developing solution supply pipe 42 extends. Accordingly, the particles collected from the treatment solution are distributed to the whole developing solution supply pipe 42. This makes it possible to further suppress the temporal change in particle collecting efficiency.

Note that the present invention is not limited to the above-described embodiment but may employ various modifications. For example, as illustrated in (A) of FIG. 12, the interval between the positive electrode 61A and the negative electrode 61B on the upstream side (the left side in (A) of FIG. 12) in the developing solution supply pipe 42 may be equal to the interval between the positive electrode 61A and the negative electrode 61B on the downstream side (the right side in (A) of FIG. 12) in the developing solution supply pipe 42.

Figure 12:
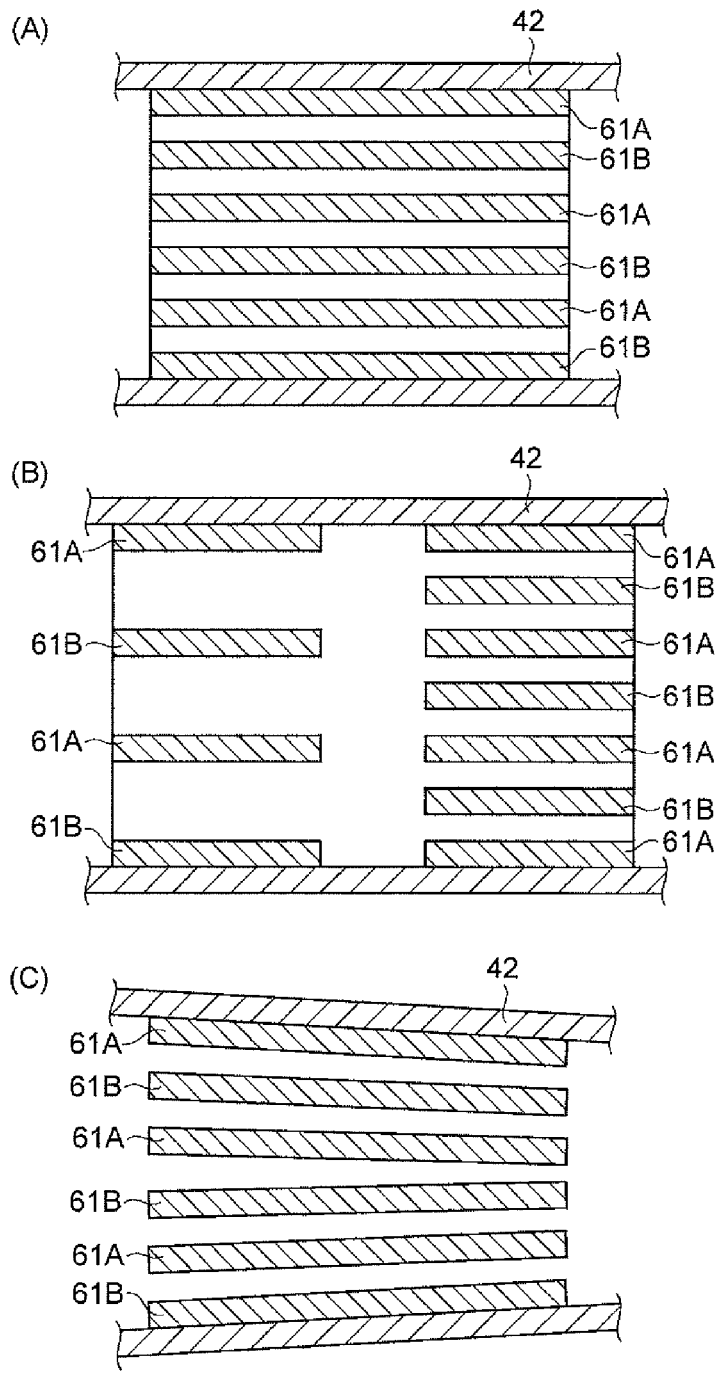
FIG. 12 is a schematic view illustrating examples of arrangement of electrodes.

Further, as illustrated in (B) and (C) of FIG. 12, the interval between the positive electrode 61A and the negative electrode 61B on the upstream side (the left side in (B), (C) of FIG. 12) in the developing solution supply pipe 42 may be larger than the interval between the positive electrode 61A and the negative electrode 61B on the downstream side (the right side in (B), (C) of FIG. 12) in the developing solution supply pipe 42.

Concretely, in the example illustrated in (B) of FIG. 12, smaller numbers of the positive electrodes 61A and the negative electrodes 61B are arranged at larger intervals on the upstream side of the developing solution supply pipe 42. On the other hand, larger numbers of the positive electrodes 61A and the negative electrodes 61B are arranged at smaller intervals on the downstream side of the developing solution supply pipe 42.

Further, in the example illustrated in (C) of FIG. 12, the diameter of the developing solution supply pipe 42 gradually decreases from the upstream side toward the downstream side. Furthermore, the positive electrodes 61A and the negative electrodes 61B are arranged to gradually decrease the intervals therebetween from the upstream side toward the downstream side of the developing solution supply pipe 42 according to the change in diameter of the developing solution supply pipe 42.

As described above, when the interval between the electrodes of the electrode pair 61 on the upstream side of the developing solution supply pipe 42 is larger than the interval between the electrodes of the electrode pair 61 on the downstream side of the developing solution supply pipe 42, the following effect can be obtained. There is a tendency that when the interval between the electrodes of the electrode pair 61 is large, particles with larger electric charge are collected, whereas particles with smaller electric charge are not collected but pass to the downstream side, as compared with the interval between the electrodes of the electrode pair 61 is small. Therefore, the between the electrodes of between the electrode pair 61 on the upstream side of the developing solution supply pipe 42 is made larger than the interval between the electrodes of the electrode pair 61 on the downstream side of the developing solution supply pipe 42, thereby making it possible to collect particles with larger electric charge on the upstream side of the developing solution supply pipe 42 and collect particles with smaller electric charge on the downstream side of the developing solution supply pipe 42. Accordingly, it is possible to equalize the numbers of particles collected on the upstream side and the downstream side of the developing solution supply pipe 42 and therefore further suppress the temporal change in particle collecting efficiency.

Figure 13:
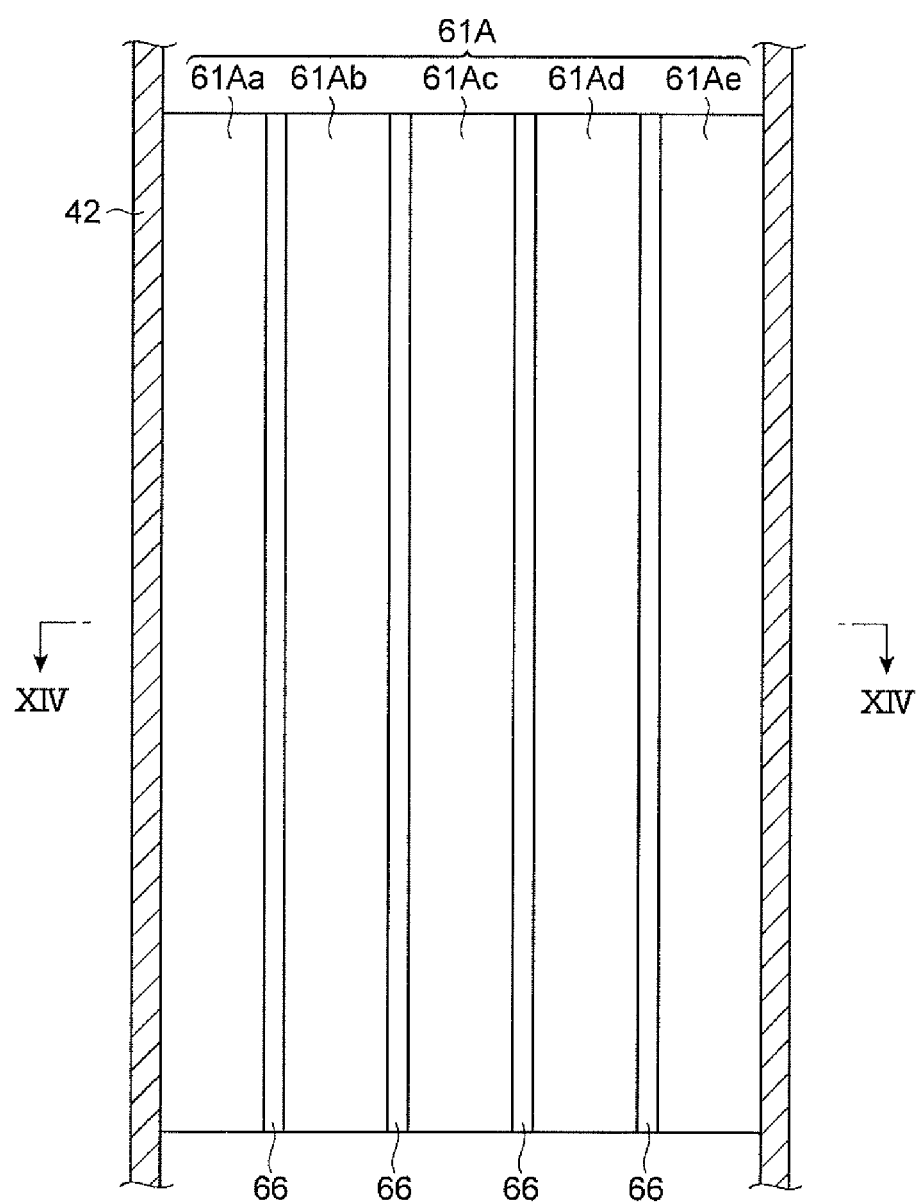
FIG. 13 is a plan view illustrating an example of arrangement of electrodes.

Further, a plurality of segments made by dividing each of the positive electrode 61A and the negative electrode 61B being the electrodes included in the electrode pair 61, by boundaries along the direction in which the developing solution supply pipe 42 extends. Such an example is illustrated in FIG. 13 and FIG. 14(A). FIG. 13 is a plan view illustrating the positive electrode 61A, and FIG. 14(A) is a cross-sectional view taken along a line XIV-XIV in FIG. 13.

The positive electrode 61A has five segments 61Aa to 61Ae divided along the direction in which the developing solution supply pipe 42 extends. The negative electrode 61B has five segments 61Ba to 61Be divided along the direction in which the developing solution supply pipe 42 extends. Adjacent segments 61Aa to 61Ae are electrically insulated from each other by an insulating member 66 along the direction in which the developing solution supply pipe 42 extends, and adjacent segments 61Ba to 61Be are similarly electrically insulated from each other.

The power supply unit 62 applies different potentials to the segments 61Aa to 61Ae and the segments 61Ba to 61Be respectively. As an example, the power supply unit 62 applies the DC voltage of a potential difference of 100 V between the segment 61Ac and the segment 61Bc which are located on the middle side of the developing solution supply pipe 42. Further, the power supply unit 62 applies the DC voltage of a potential difference of 75 V between the segment 61Ab and the segment 61Bb and between the segment 61Ad and the segment 61Bd, which are adjacent to the segment 61Ac and the segment 61Bc. Furthermore, the power supply unit 62 applies the DC voltage of a potential difference of 50 V between the segment 61Aa and the segment 61Ba and between the segment 61Ae and the segment 61Be, which are closest to the pipe wall of the developing solution supply pipe 42.

Figure 15:
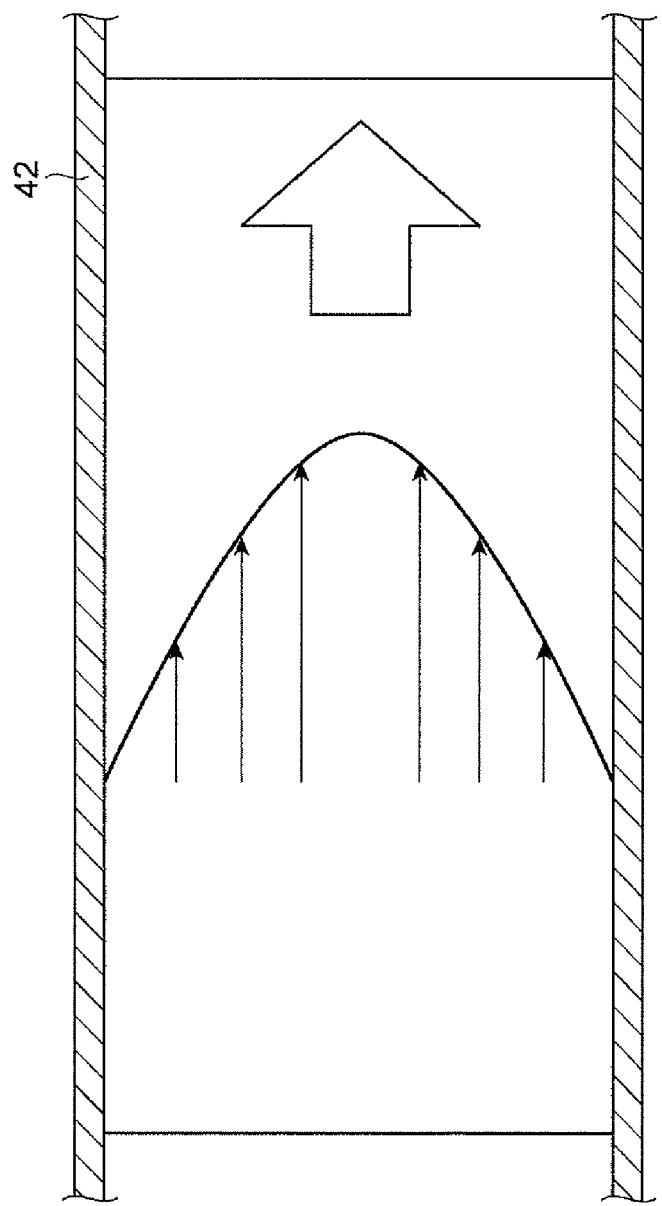
FIG. 15 is a view schematically illustrating a flow rate distribution of a treatment solution in a treatment solution pipe.

As described above, when the positive electrode 61A and the negative electrode 61B included in the electrode pair 61 have the plurality of segments 61Aa to 61Ae, 61Ba to 61Be divided along the direction in which the developing solution supply pipe 42 extends, and the control unit 100 controls the DC voltage in a manner to apply a higher DC voltage to segments located closer to the middle side of the treatment solution supply pipe among the plurality of segments 61Aa to 61Ae, 61Ba to 61Be, the following effect can be obtained. Generally, the flow rate of liquid passing through the middle portion of the pipe is higher than the flow rate of the liquid passing through the side closer to the pipe wall as illustrated with arrows in FIG. 15. Further, to collect particles with a constant collecting efficiency, it is necessary to apply a higher DC voltage to the treatment solution as the flow rate of the treatment solution is higher. Accordingly, applying the highest DC voltage to the segments located closer to the middle side of the developing solution supply pipe 42 among the segments 61Aa to 61Ae, 61Ba to 61Be and decreasing the DC voltage to be applied as they are farther from the middle makes it possible to uniformize the particle collecting efficiency on the middle side and the pipe wall side of the developing solution supply pipe 42 and further suppress the temporal change in collecting efficiency.

Note that instead of dividing the positive electrode 61A and the negative electrode 61B into the plurality of segments 61Aa to 61Ae, 61Ba to 61Be by the insulating members 66, partitions (straightening members) 67 may be arranged in a flow path between the positive electrode 61A and the negative electrode 61B along the direction in which the developing solution supply pipe 42 extend as illustrated in FIG. 14(B) so that the developing solution uniformly flows through the inside of the developing solution supply pipe 42. The partition 67 is composed of an insulating material such as a resin.

Figure 17:
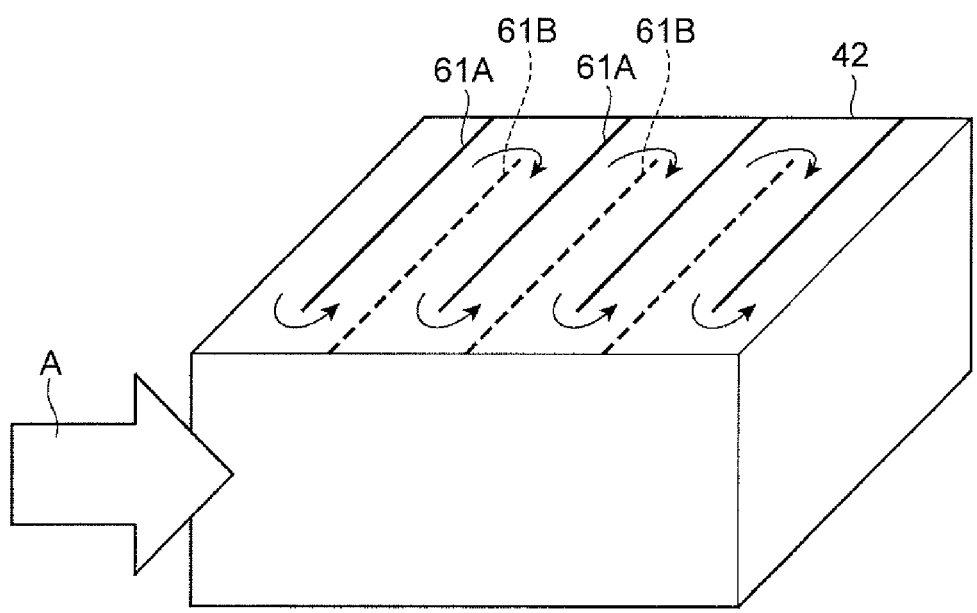
FIG. 17 is a view illustrating an example of arrangement of electrodes in the treatment solution pipe.

Further, modification examples of the arrangement of the positive electrode 61A and the negative electrode 61B are illustrated in FIG. 16, FIG. 17. Each of them is for increasing a liquid contact area being an area where the positive electrode 61A and the negative electrode 61B are in contact with the developing solution. Note that arrows A in FIG. 16 and FIG. 17 indicate the direction in which the developing solution flows.

(A) of FIG. 16 is an example in which a plurality of the positive electrodes 61A and the negative electrodes 61B are arranged so that their cross sections are concentric circular shapes in the developing solution supply pipe 42 with a circular cross section. (B) of FIG. 16 is an example in which a plurality of the positive electrodes 61A and the negative electrodes 61B are arranged so that their cross sections are concentric star shapes. (C) of FIG. 16 is an example in which a plurality of the positive electrodes 61A and the negative electrodes 61B are arranged as a plurality of flat plates parallel to the direction in which the developing solution supply pipe 42 extends. Each of them is an example in which the flow of the developing solution is parallel to the direction in which the developing solution supply pipe 42 extends, namely, the flow of the developing solution forms a laminar flow.

On the other hand, FIG. 17 is an example in which the positive electrodes 61A and the negative electrodes 61B are arranged as a flat plate arranged in the direction perpendicular to the direction in which the developing solution supply pipe 42 extends. In this example, the developing solution meanders along the positive electrodes 61A and the negative electrodes 61B.

The pair of probes 63 may be arranged in any way as long as they can detect the potential difference between two points separate from each other in the facing direction of the electrode pair 61. As described above, the probes 63 may be arranged on the upstream side from a region (hereinafter, referred to as a "voltage application region") between the electrodes of the electrode pair 61. The particles in the treatment solution are collected in a process of passing through the voltage application region, and therefore the number of particles in the treatment solution decreases as it goes from the upstream side to the downstream side of the voltage application region. Therefore, the particles are likely to accumulate at the electrode pair 61 on the upstream side from the voltage application region more than on the downstream side from the voltage application region. Accordingly, when the probes 63 are arranged on the upstream side from the voltage application region, a decrease in potential difference caused by the accumulation of the particles can be early detected.

The probes 63 may be arranged on the downstream side from the voltage application region. In this case, the detection place for the potential difference is set to the downstream side where the decrease in potential difference is unlikely to occur, whereby the downstream side from the voltage application region can also be sufficiently utilized for removal of particles.

Figure 18:
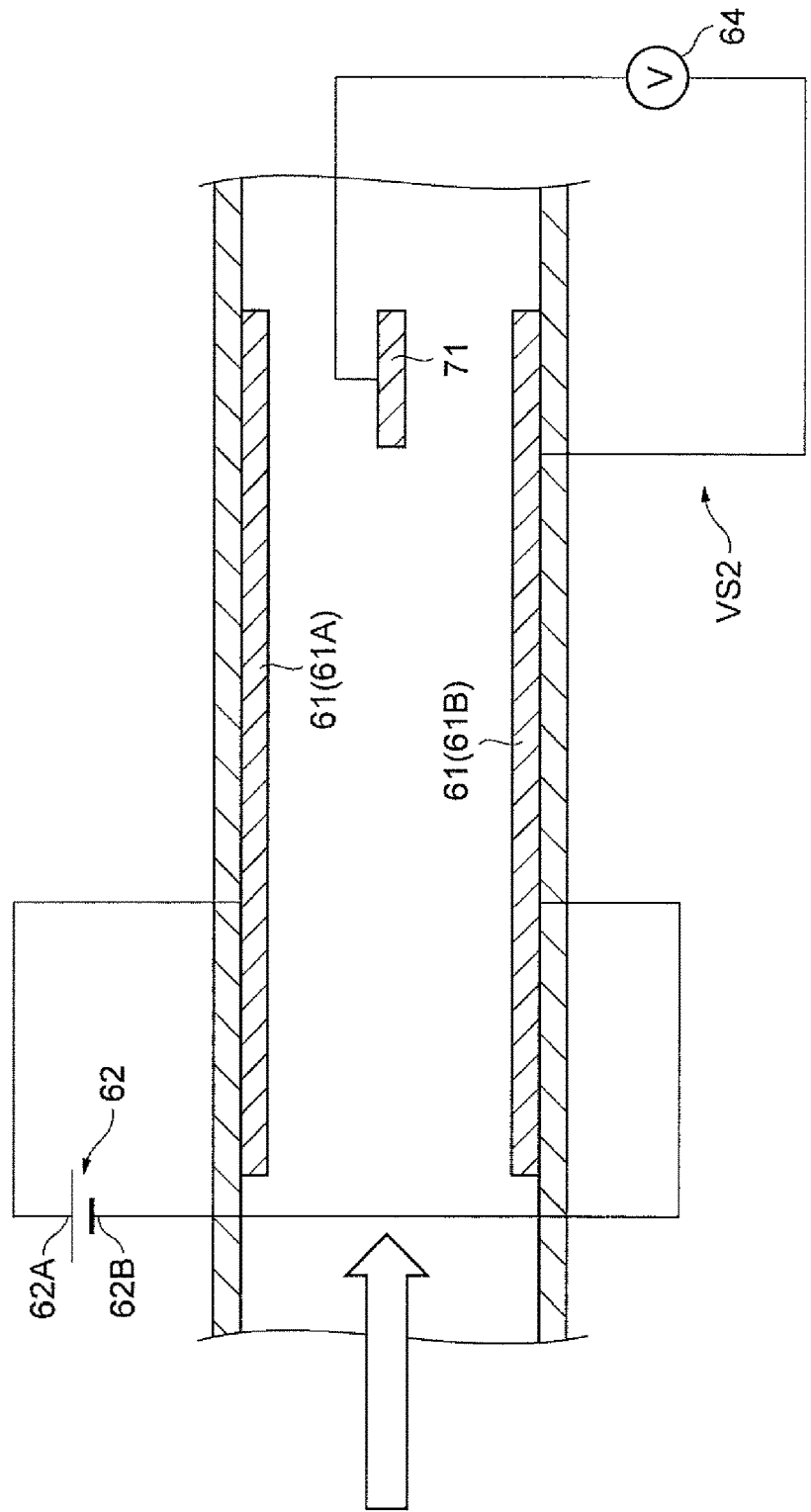
FIG. 18 is a schematic view illustrating a modification example of the treatment solution supply apparatus.

The developing solution supply apparatus 40 may have, as illustrated in FIG. 18, a potential difference detector VS2 in place of the potential difference detector VS1. The potential difference detector VS2 has a probe 71 in place of the pair of probes 63. The probe 71 is disposed between the electrodes of the electrode pair 61. The voltage sensor 64 of the potential difference detector VS2 detects a potential difference between one of the electrodes of the electrode pair 61 and the probe 71 in place of the potential difference between the probes 63. Such a configuration can also detect the potential difference between two points separate from each other in the facing direction of the electrode pair 61.

Second Embodiment

Treatment Solution Supply Apparatus

Figure 19:
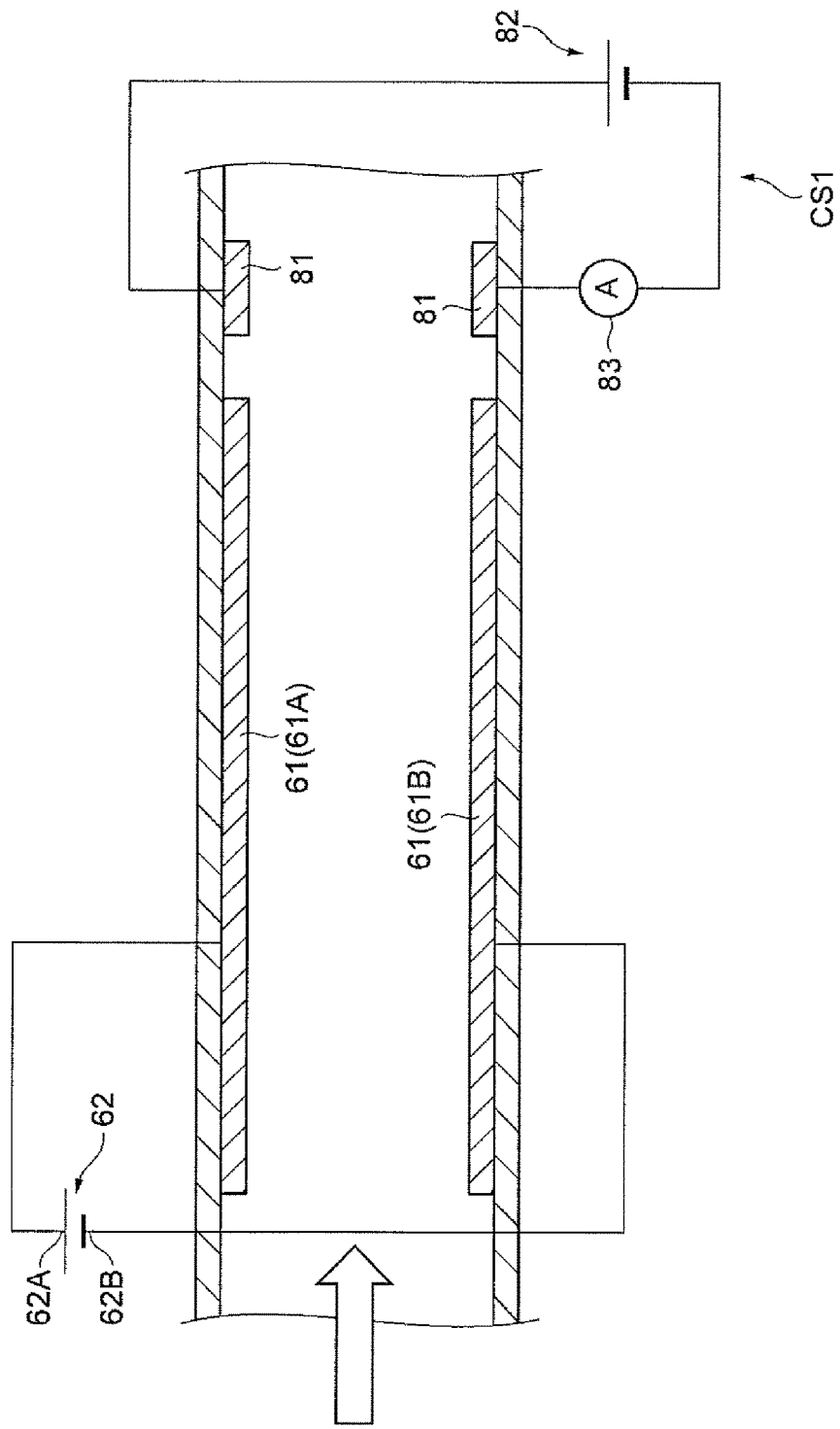
FIG. 19 is a schematic view illustrating a treatment solution supply apparatus according to a second embodiment.

Subsequently, a second embodiment of the treatment solution supply apparatus will be described. A developing solution supply apparatus according to the second embodiment is made by replacing the potential difference detector VS1 of the developing solution supply apparatus 40 with a current detector CS1. The current detector CS1 has a pair of probes 81, a power supply unit 82, and a current sensor 83 as illustrated in FIG. 19.

The pair of probes 81 are disposed between two points in the treatment solution. As one example, the pair of probes 81 are adjacent to the downstream side from the positive electrode 61A and the negative electrode 61B respectively and separate from each other. The pair of probes 81 only need to be separate from each other, and there is no restriction on a direction in which they are arranged. For example, the pair of probes 81 may be arranged side by side in the direction in which the positive electrode 61A and the negative electrode 61B face each other or in a direction parallel to the positive electrode 61A and the negative electrode 61B. The power supply unit 82 applies a DC voltage to the pair of probes 81. The current sensor 83 is interposed between the pair of probes 81 and the power supply unit 82 and detects current. The current detected by the current sensor 83 is equal to the current flowing between the probes 81. Therefore, the current between two points can be detected by the current sensor 83.

The control unit 100 in the second embodiment controls the power supply unit 62 to increase the DC voltage between the electrodes of the electrode pair 61 when the current detected by the current detector CS1 is more than a predetermined reference value RF2 (second reference value, namely, reference current). The reference value RF2 is set in advance, for example, based on the current value actually measured for the treatment solution in which an allowable number of particles remain.

(Treatment Solution Supply Method)

Figure 20:
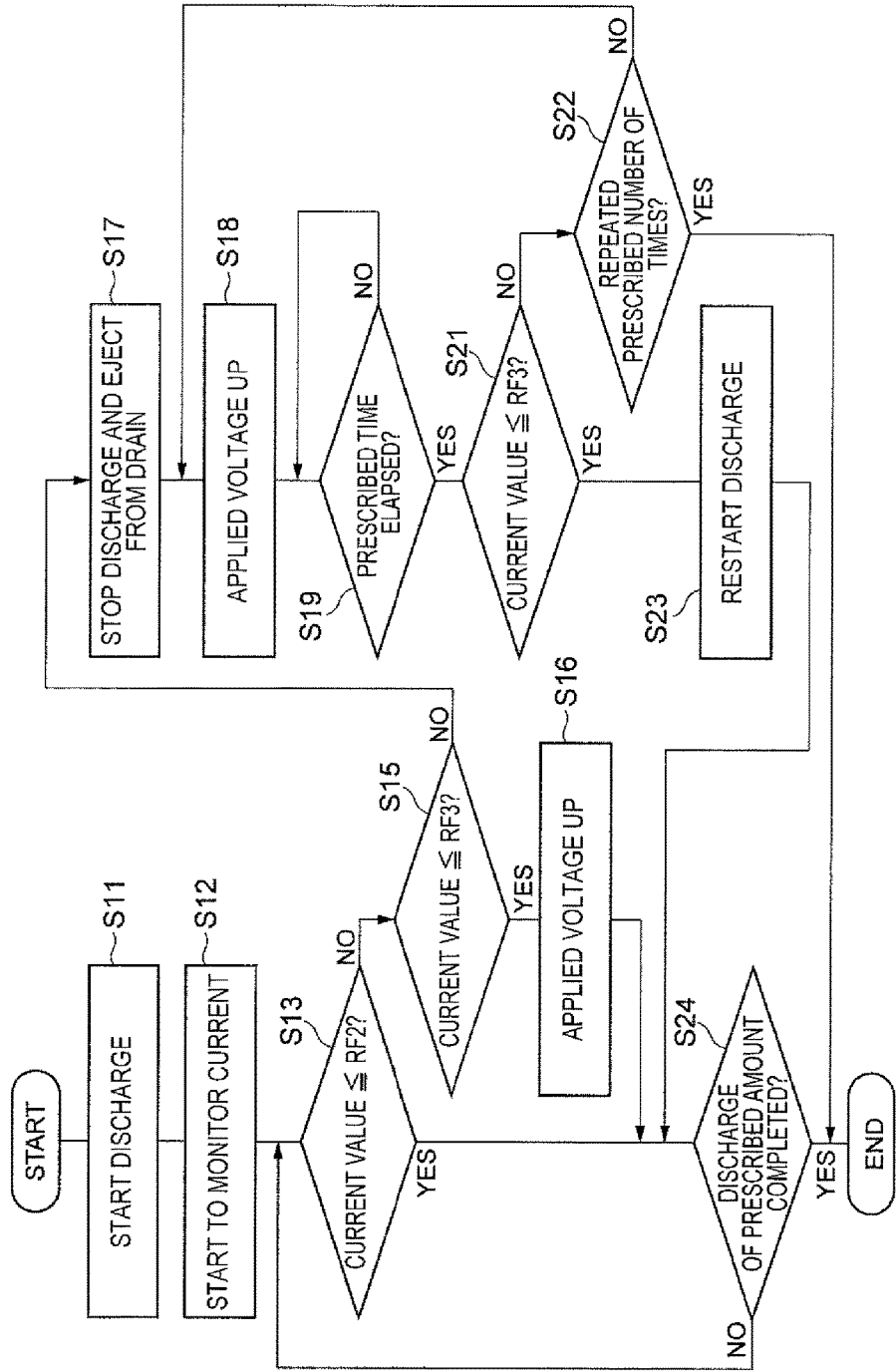
FIG. 20 is a flowchart illustrating a treatment solution supply method according to the second embodiment.

Hereinafter, as an example of the treatment solution supply method, a developing solution supply procedure by the developing solution supply apparatus in the second embodiment will be described. As illustrated in FIG. 20, first, the developing solution supply apparatus performs Step S11. At Step S11, the control unit 100 controls the pump 46, the valves 47, 48 and the valve 54 to start discharge of the developing solution.

Next, the developing solution supply apparatus performs Step S12. At Step S12, the control unit 100 starts to monitor the detection value (hereinafter, referred to as a "current value") by the current sensor 83.

Next, the developing solution supply apparatus performs Step S13. At Step S13, the control unit 100 confirms whether or not the current value is the reference value RF2 or less. The reference value RF2 is, for example, a value lower than the current value when the number of particles in the developing solution is at the allowable limit. The allowable limit is the maximum value of the number of particles not affecting the quality of the wafer after development, and can be found through experiments.

At Step S13, it is determined that the current value is the reference value RF2 or less, the developing solution supply apparatus performs later-described Step S24. At Step S13, it is determined that the current value is more than the reference value RF2, the developing solution supply apparatus performs Step S15. At Step A15, the control unit 100 confirms whether or not the current value is a predetermined reference value RF3 or less. The reference value RF3 is set to a value larger than the reference value RF2. The reference value RF3 is, for example, the current value when the number of particles in the developing solution is at the allowable limit.

At Step S15, it is determined that the current value is the reference value RF3 or less, the developing solution supply apparatus performs Step S16. At Step S16, the control unit 100 controls the power supply unit 62 to increase the voltage between the electrodes of the electrode pair 61. Thereafter, the developing solution supply apparatus performs later-described Step S24.

At Step S15, it is determined that the current value is more than the reference value RF3, the developing solution supply apparatus performs Steps S17, S18. At Step S17, the control unit 100 controls the valves 48, 54 to stop the discharge of the developing solution from the nozzle N1 and discharge the developing solution to the waste solution part 55. At Step S18, the control unit 100 controls the power supply unit 62 to increase the voltage between the electrodes of the electrode pair 61.

Next, the developing solution supply apparatus performs Step S21 after waiting for a lapse of a prescribed time (Step S19). At Step S21, the control unit 100 confirms again whether or not the current value is the reference value RF3 or less. Note that the prescribed time can be arbitrarily set.

At Step S21, it is determined that the current value is still more than the reference value RF3, the developing solution supply apparatus performs Step S22. At Step S22, the control unit 100 confirms whether or not Step S21 has been repeated a prescribed number of times. When it is determined at Step S22 it is determined that Step S21 has not been repeated the prescribed number of times, the developing solution supply apparatus returns the processing to Step S18. Thus, the adjustment of the voltage value is repeated until Step S21 has been repeated the prescribed number of times. Note that the prescribed number of times can be arbitrarily set. When it is determined at Step S22 that Step S21 has been repeated the prescribed number of times, the developing solution supply apparatus stops the processing.

When it is determined at Step S21 that the current value is the reference value RF3 or less, the developing solution supply apparatus performs Step S23. At Step S23, the control unit 100 controls the valves 48, 54 to restart the discharge of the developing solution from the nozzle N1.

Thereafter, the developing solution supply apparatus performs Step S24. At Step S24, the control unit 100 confirms whether or not discharge of a prescribed amount has been completed. When it is determined at Step S24 that the discharge of the prescribed amount has not been completed, the developing solution supply apparatus returns the processing to Step S13. Thus, the discharge of the treatment solution is continued until the discharge of the prescribed amount is completed. Note that the prescribed amount can be arbitrarily set. When it is determined at Step S24 that the discharge of the prescribed amount has been completed, the developing solution supply apparatus completes the discharge of the developing solution.

Figure 21:
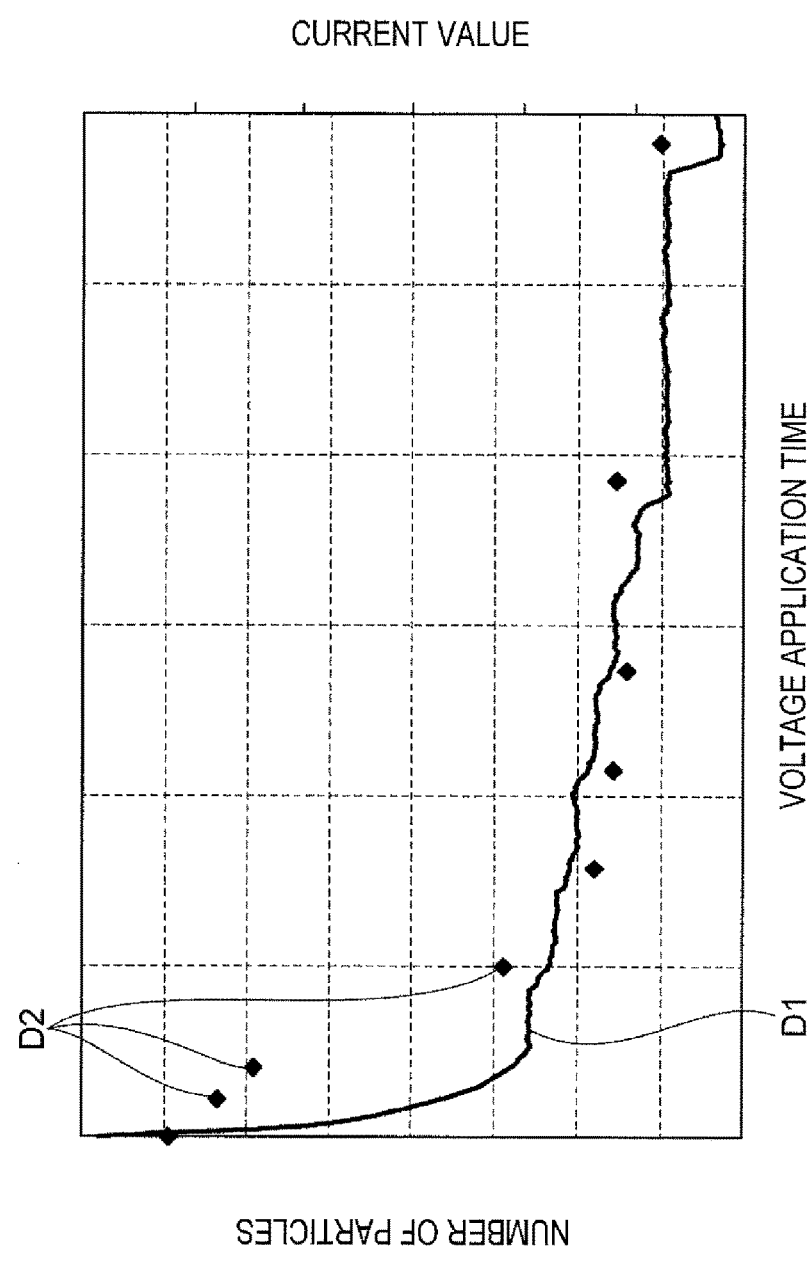
FIG. 21 is a graph indicating the relationship between the number of particles and current.

According to the developing solution supply apparatus in the second embodiment, the DC voltage applied to the treatment solution is increased when the current flowing between the two points in the treatment solution is more than the reference value RF2. FIG. 21 is a graph representing the relationship between the number of particles and the current. The horizontal axis indicates the voltage application time. Dot data D2 indicates the number of particles. Line data D1 indicates change in current. As indicated by the data D2, the number of particles decreases as the voltage application time increases. Further, the decrease in the number of particles slows down as the voltage application time increases. As indicated by the data D1, the current also changes similarly to the number of particles. As described above, the current flowing between the two points in the treatment solution correlates with the number of particles in the treatment solution. Therefore, when the current is more than the reference value RF2, the DC voltage is increased to enable the particles in the treatment solution to be more surely collected.

The current detector CS1 may detect the current flowing between the two points in the treatment solution on the downstream side from the electrode pair 61. In this case, it is possible to detect the state of particles remaining in the treatment solution directly before supply and adjust the DC voltage according to the state. Therefore, it is possible to more surely reduce the number of particles remaining in the treatment solution after supply.

Figure 22:
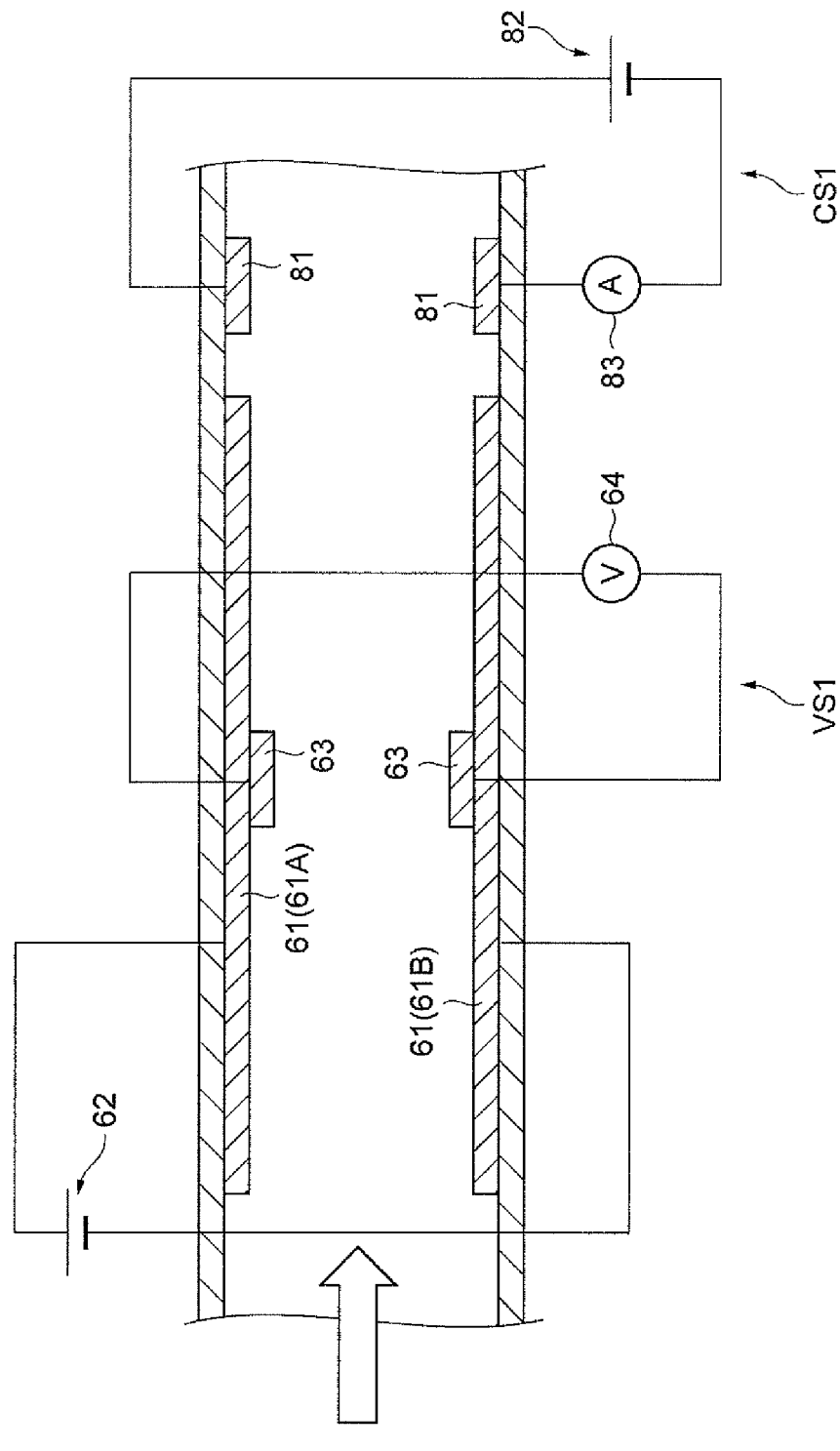
FIG. 22 is a schematic view illustrating a modification example of the treatment solution supply apparatus.

Embodiments have been described above, but the present invention is not always limited to the above-described embodiments. Various changes can be made without departing from the scope of the invention. As illustrated in FIG. 22, for example, the potential difference detector VS1 and the current detector CS1 may be combined for use. In this case, the control unit 100 may control the power supply unit 62 to increase the DC voltage when at least one of a state where the potential difference detected by the potential difference detector VS1 is less than the reference value RF1 and a state where the current detected by the current detector CS1 is more than the reference value RF2 applies. This makes it possible to more surely collect the particles in the treatment solution.

Further, the configuration exemplified as the developing solution supply apparatus is applicable also to a treatment solution supply apparatus configured to supply other treatment solutions other than the developing solution, such as pure water, thinner, resist, etching solution. Further, the substrate to be treated is not limited to the semiconductor wafer. Examples of the substrate other than the semiconductor wafer include a glass substrate, a mask substrate, an FPD (Flat Panel Display) and so on.

What is claimed is:

1. A treatment solution supply method of supplying a treatment solution to a substrate, the method comprising the steps of:
    applying a DC voltage to the treatment solution;
    detecting a current flowing between two points in the treatment solution, or detecting the current and a potential difference between the two points in a state where the DC voltage is applied to the treatment solution; and
    increasing the DC voltage when the detected current is more than a predetermined reference current, or when the detected current is more than the predetermined reference current and the detected potential difference is less than a reference potential difference.

2. The treatment solution supply method according to claim 1, further comprising the step of:
    before the step of applying the DC voltage to the treatment solution, passing the treatment solution through a filter.

3. The treatment solution supply method according to claim 1,
    wherein the DC voltage is applied to the treatment solution that is passing through a treatment solution supply pipe.

4. The treatment solution supply method according to claim 3,
    wherein the current flowing between the two points in the treatment solution is detected on a downstream side from a place to which the DC voltage is applied.

5. A treatment solution supply apparatus configured to supply a treatment solution to a substrate, the apparatus comprising:
    a treatment solution supply pipe that supplies the treatment solution to the substrate;
    an electrode pair that is provided in the treatment solution supply pipe and applies a DC voltage to the treatment solution in the treatment solution supply pipe;
    a DC power supply that applies the DC voltage to the electrode pair; and
    a processor and a memory, the processor controls the DC power supply,
    wherein the treatment solution supply apparatus further comprises:
        a current detector that detects a current flowing between two points in the treatment solution in a state where the DC voltage is applied to the treatment solution, or
        the current detector and a potential difference detector that detects a potential difference between two points in the treatment solution supply pipe separate from each other in a facing direction of the electrode pair in a state where the DC voltage is applied to the treatment solution;
    wherein the processor is configured to execute a program stored in the memory to: control the DC power supply to increase the DC voltage when the detected current is more than a predetermined reference current, or when the detected current is more than the predetermined reference current and the potential difference detected by the potential difference detector is less than a reference potential difference.

6. The treatment solution supply apparatus according to claim 5, further comprising:
    a straightening member at least on an upstream side from a portion where the electrode pair is provided in the treatment solution supply pipe.

7. The treatment solution supply apparatus according to claim 5, further comprising:
    a straightening member between electrodes of the electrode pair in the treatment solution supply pipe.

8. The treatment solution supply apparatus according to claim 5,
    wherein an interval between electrodes of the electrode pair on an upstream side of the treatment solution supply pipe is larger than an interval between electrodes of the electrode pair on a downstream side of the treatment solution supply pipe.

9. The treatment solution supply apparatus according to claim 5,
    wherein each of electrodes constituting the electrode pair has a plurality of segments divided by boundaries along a direction in which the treatment solution supply pipe extends, and
    wherein the processor is further configured to control the DC voltage to apply a higher DC voltage to a segment located closer to a middle side of the treatment solution supply pipe among the plurality of segments.

10. The treatment solution supply apparatus according to claim 5,
    wherein the electrode pair is made of at least one kind selected from a group consisting of metal, Si doped with a dopant, Ge doped with a dopant, SiC, and vitrified carbon.

11. The treatment solution supply apparatus according to claim 5,
    wherein the current detector detects a current flowing between two points in the treatment solution on a downstream side from the electrode pair.

12. A non-transitory computer-readable recording medium recording a program thereon for causing a treatment solution supply apparatus configured to supply a treatment solution to a substrate to perform a treatment solution supply method of supplying a treatment solution to a substrate,
    the treatment solution supply method comprising the steps of:
    applying a DC voltage to the treatment solution;
    detecting a current flowing between two points in the treatment solution, or detecting the current and a potential difference between the two points in a state where the DC voltage is applied to the treatment solution; and
    increasing the DC voltage when the detected current is more than a predetermined reference current, or when the detected current is more than the predetermined reference current and the detected potential difference is less than a reference potential difference.

13. The non-transitory computer-readable recording medium according to claim 12, further comprising:
   wherein the treatment solution is passed through a filter, before applying the DC voltage to the treatment solution.

14. The non-transitory computer-readable recording medium according to claim 12,
   wherein the DC voltage is applied to the treatment solution that is passing through a treatment solution supply pipe.

15. The non-transitory computer-readable recording medium according to claim 14,
   wherein the current flowing between the two points in the treatment solution is detected on a downstream side from a place to which the DC voltage is applied.

* * * * *